(12) United States Patent
Tanaka et al.

(10) Patent No.: US 12,310,076 B2
(45) Date of Patent: May 20, 2025

(54) SILICON CARBIDE SEMICONDUCTOR DEVICE, POWER CONVERSION APPARATUS, AND METHOD FOR MANUFACTURING SILICON CARBIDE SEMICONDUCTOR DEVICE

(71) Applicant: Mitsubishi Electric Corporation, Tokyo (JP)

(72) Inventors: Rina Tanaka, Tokyo (JP); Yutaka Fukui, Tokyo (JP); Hideyuki Hatta, Tokyo (JP); Kohei Adachi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 422 days.

(21) Appl. No.: 17/777,070

(22) PCT Filed: Nov. 28, 2019

(86) PCT No.: PCT/JP2019/046600
§ 371 (c)(1),
(2) Date: May 16, 2022

(87) PCT Pub. No.: WO2021/106152
PCT Pub. Date: Jun. 3, 2021

(65) Prior Publication Data
US 2022/0406897 A1  Dec. 22, 2022

(51) Int. Cl.
*H01L 21/04*  (2006.01)
*H01L 29/16*  (2006.01)
(Continued)

(52) U.S. Cl.
CPC ..... *H10D 62/8325* (2025.01); *H01L 21/0465* (2013.01); *H02M 7/53871* (2013.01); *H10D 30/668* (2025.01); *H10D 62/393* (2025.01)

(58) Field of Classification Search
CPC ... H01L 21/0465; H01L 21/04; H01L 21/047; H01L 21/266; H01L 21/823487;
(Continued)

(56) References Cited

U.S. PATENT DOCUMENTS 10,848,073 B2 * 11/2020 Shikagawa ............. H02M 1/32
11,004,936 B2 * 5/2021 Narita ................. H01L 29/1037
(Continued)

FOREIGN PATENT DOCUMENTS

DE   10 2015 103 070 A1   9/2016
JP       20180106459    *  6/2018  ............. H01L 29/08
(Continued)

OTHER PUBLICATIONS

International Search Report and Written Opinion mailed on Feb. 18, 2020, received for PCT Application PCT/JP2019/046600, Filed on Nov. 28, 2019, 8 pages including English Translation.
(Continued)

*Primary Examiner* — Nikolay K Yushin
(74) *Attorney, Agent, or Firm* — XSENSUS LLP

(57) ABSTRACT

A silicon carbide semiconductor device includes: a body region of a second conductivity type provided on a drift layer of a first conductivity type; a source region of a first conductivity type provided on the body region; a source electrode connected to the source region; a gate insulating film provided on an inner surface of a trench; a gate electrode provided inside the trench with interposition of the gate insulating film; a protective layer of a second conductivity type provided below the gate insulating film; a connection layer of a second conductivity type being in contact with the protective layer and the body region; and an electric field relaxation layer of a second conductivity type being in contact with a bottom surface of the connection layer, provided below the connection layer, and having a lower (Continued)

impurity concentration of a second conductivity type than the connection layer.

13 Claims, 30 Drawing Sheets

(51) Int. Cl.
  *H02M 7/5387* (2007.01)
  *H10D 30/66* (2025.01)
  *H10D 62/17* (2025.01)
  *H10D 62/832* (2025.01)

(58) Field of Classification Search
  CPC ... H01L 21/088; H01L 29/1608; H01L 29/16; H01L 29/1095; H01L 29/0696; H01L 29/10; H01L 29/7813; H01L 29/4236; H01L 29/78; H01L 29/0878; H01L 29/08; H01L 29/0623; H01L 29/06; H01L 29/4238; H01L 29/423; H01L 29/66068; H02M 7/53871; H02M 7/5387; H02M 7/003; H02M 7/53875; H02M 7/797; H02M 7/219; H10D 62/8325; H10D 62/832; H10D 62/393; H10D 62/127; H10D 62/17; H10D 62/142; H10D 30/668; H10D 30/66; H10D 30/0245; H10D 30/01; H10D 44/466; H10D 44/45; H10D 44/061; H10D 44/00; H10D 44/53871; A23B 11/753; A23B 11/75; A23B 11/30; A61K 40/4246; A61K 40/42; A61K 40/4218; A61K 40/4225; H10F 39/811; H10F 39/00; H10F 39/802; H10F 39/805; H10F 77/1265; H10F 77/12; H10F 77/959
  See application file for complete search history.

(56) References Cited

U.S. PATENT DOCUMENTS

| | | | |
|---|---|---|---|
| 2016/0260798 | A1 | 9/2016 | Rupp et al. |
| 2019/0371889 | A1* | 12/2019 | Narita ............... H01L 29/66734 |
| 2020/0044577 | A1* | 2/2020 | Shikagawa ............ H02P 27/06 |
| 2021/0288156 | A1 | 9/2021 | Fukui et al. |

FOREIGN PATENT DOCUMENTS

| | | |
|---|---|---|
| JP | 2019-129290 A | 8/2019 |
| WO | 2018/225600 A1 | 12/2018 |

OTHER PUBLICATIONS

Office Action issued Feb. 26, 2024 in German Patent Application No. 11 2019 007 917.4, 25 pages.

* cited by examiner

F I G. 1
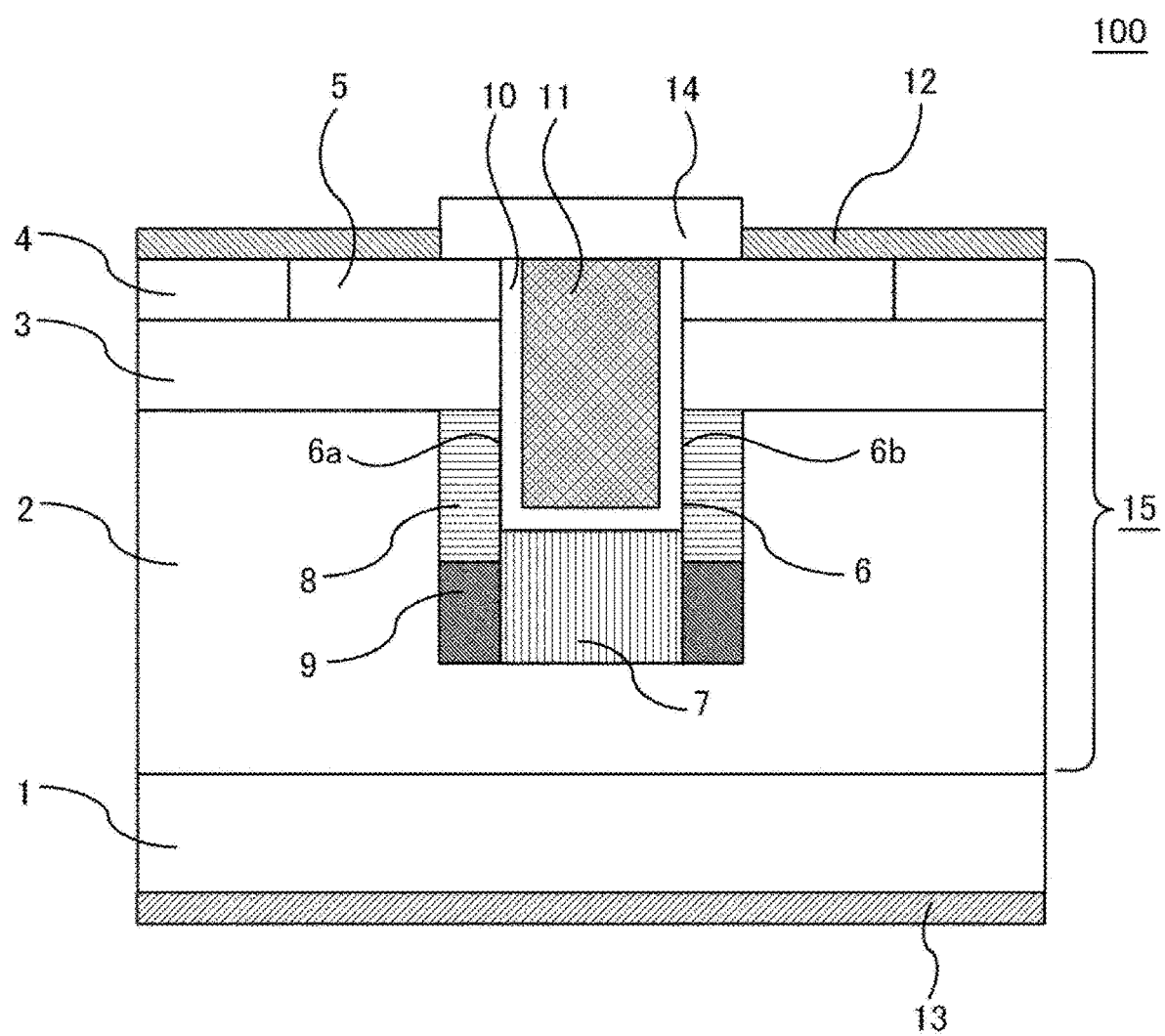

F I G. 6
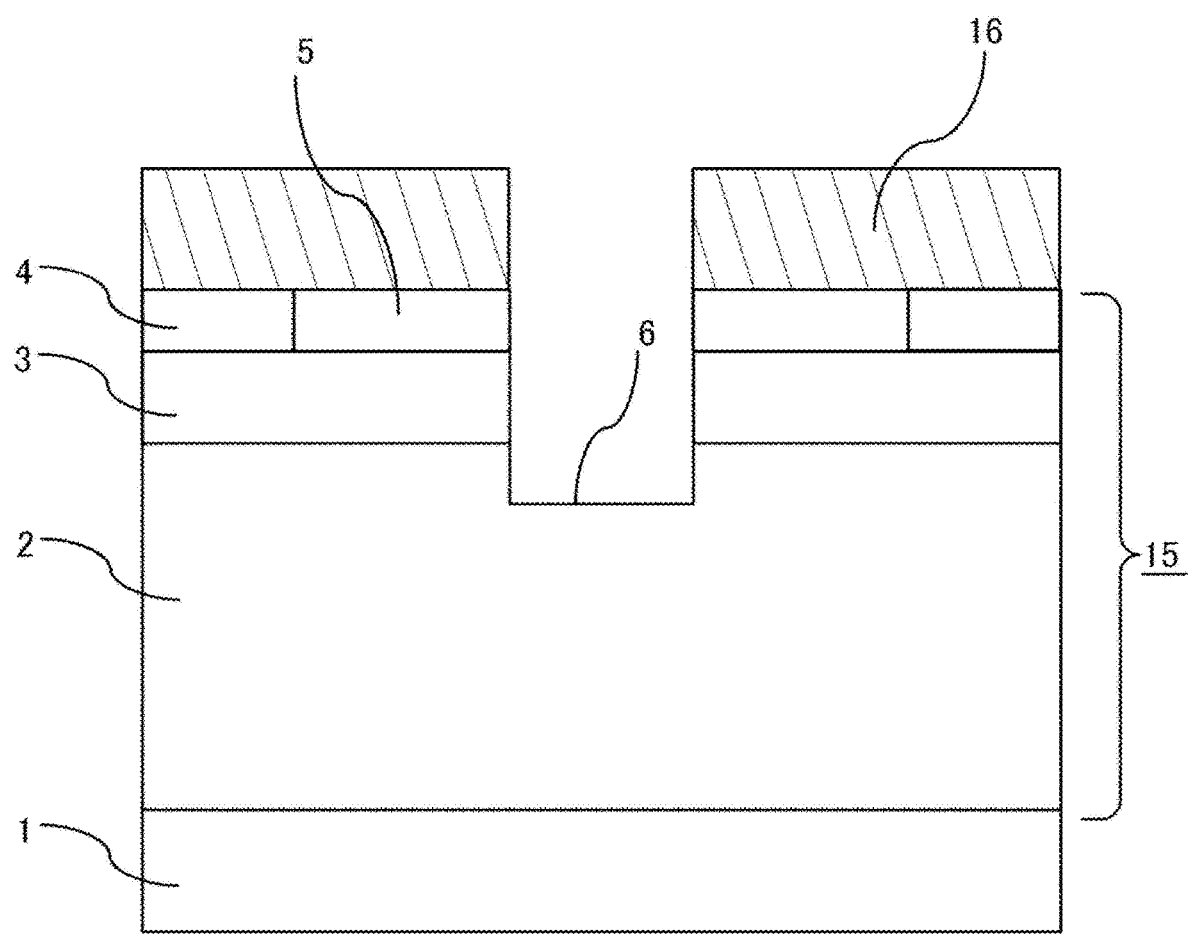

F I G. 7
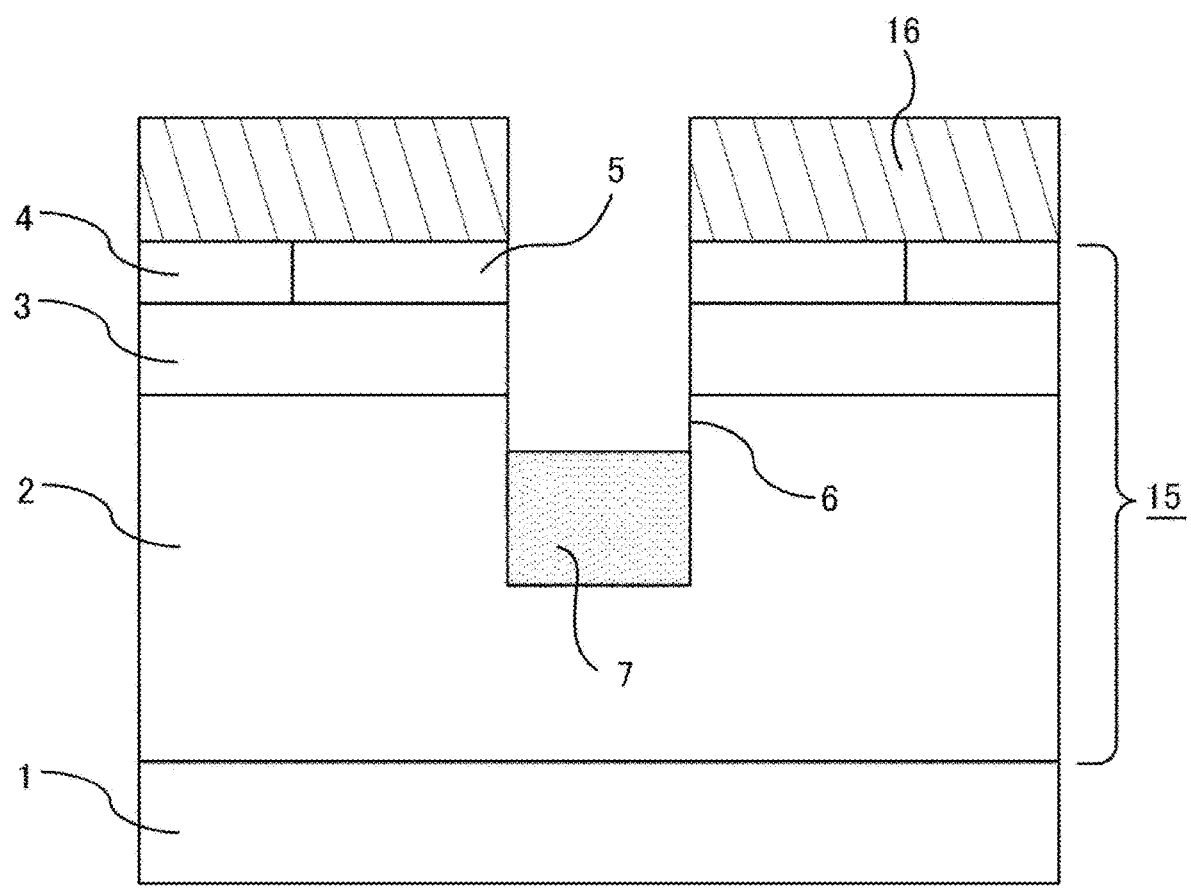

F I G. 8
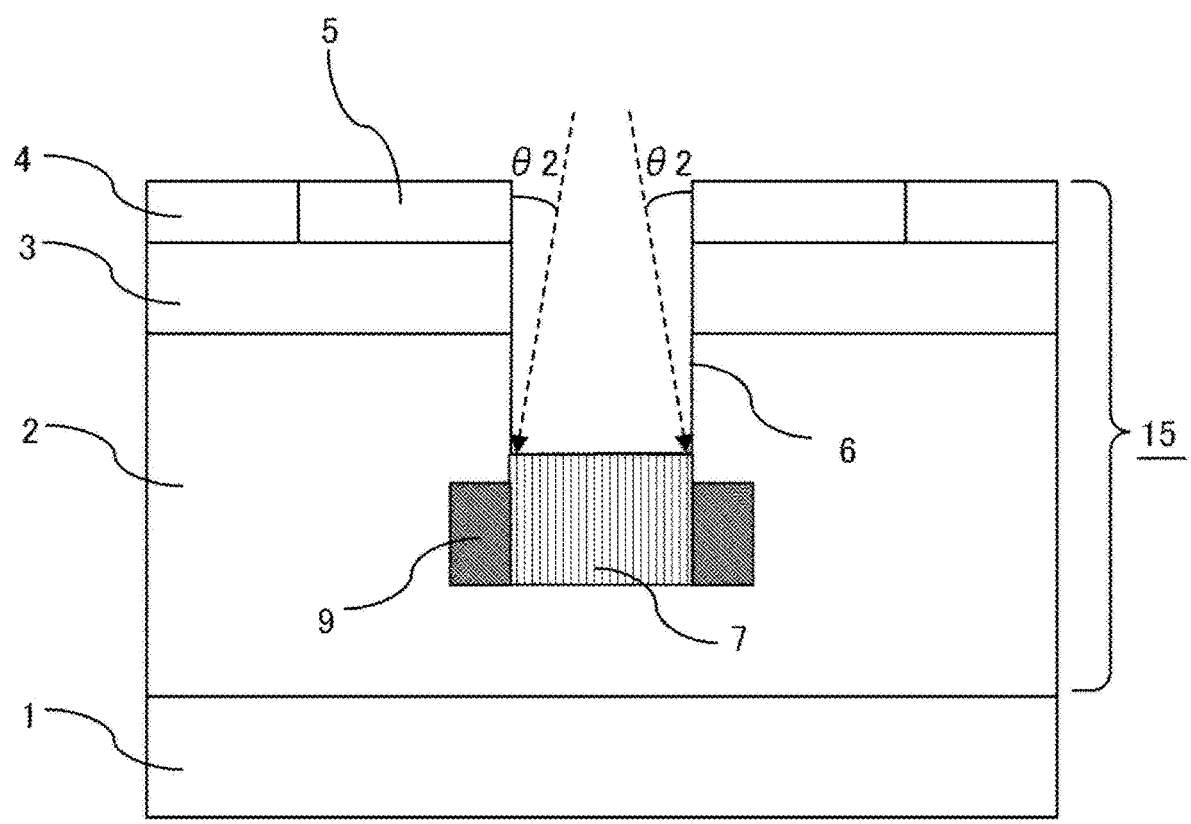

F I G. 9
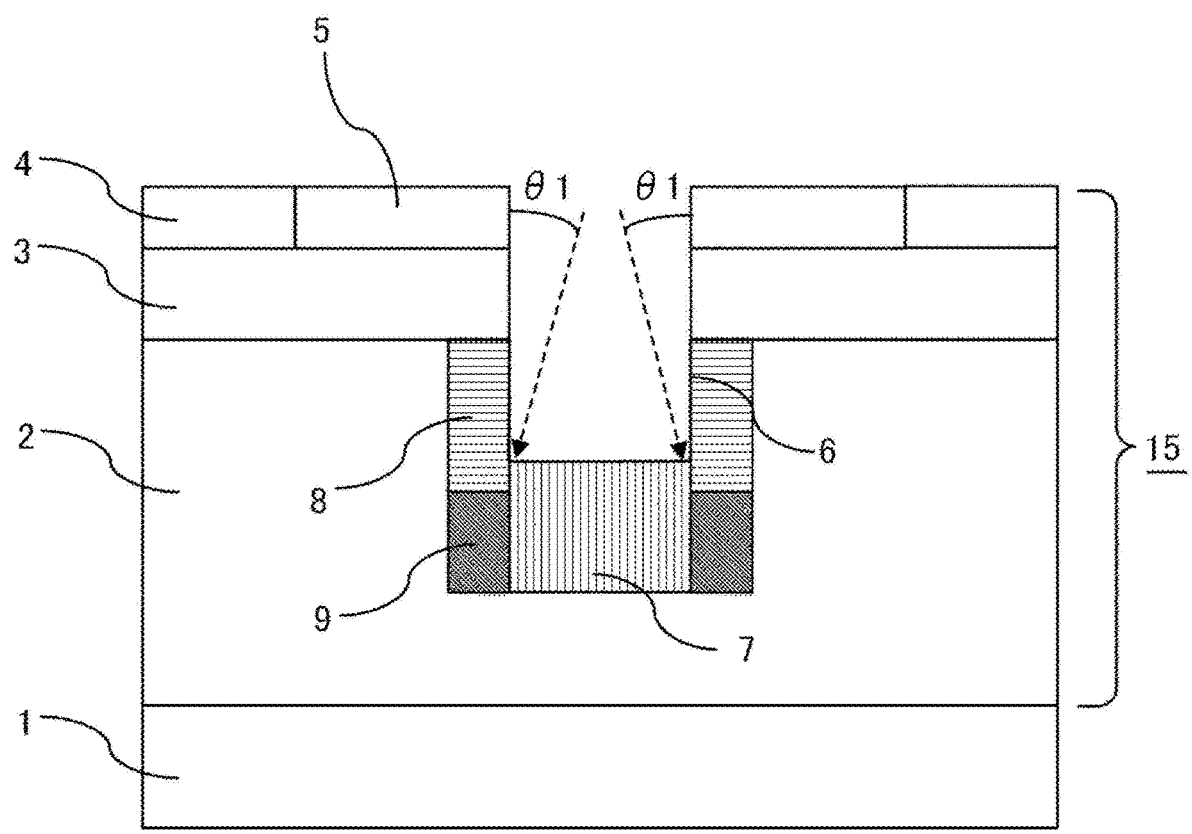

F I G. 1 1
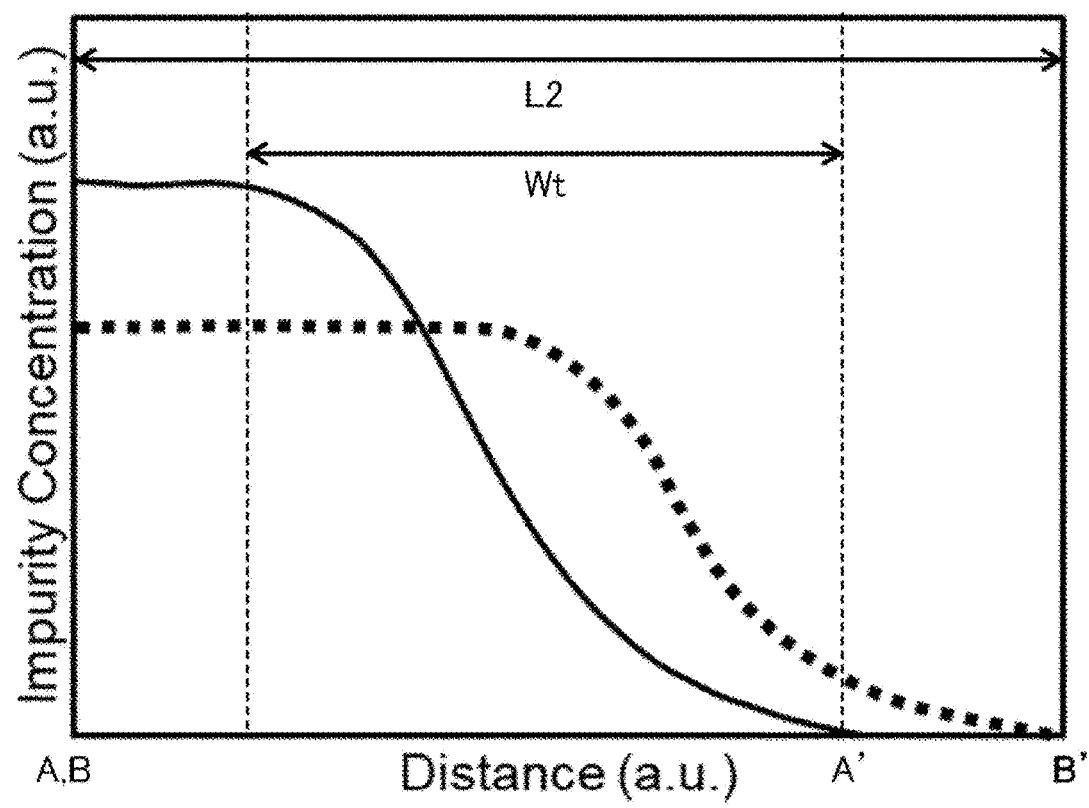

F I G. 1 2
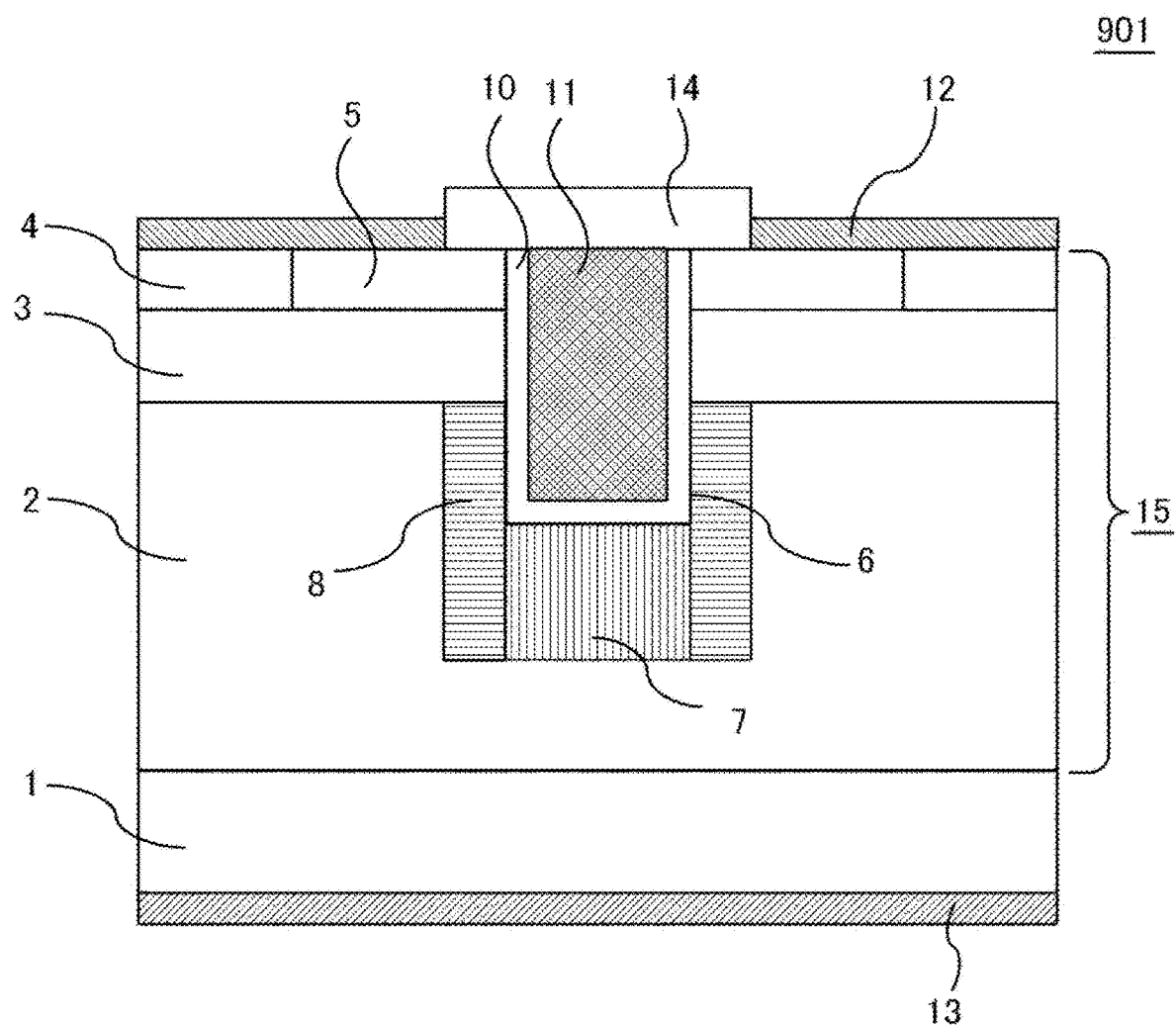

F I G. 1 3
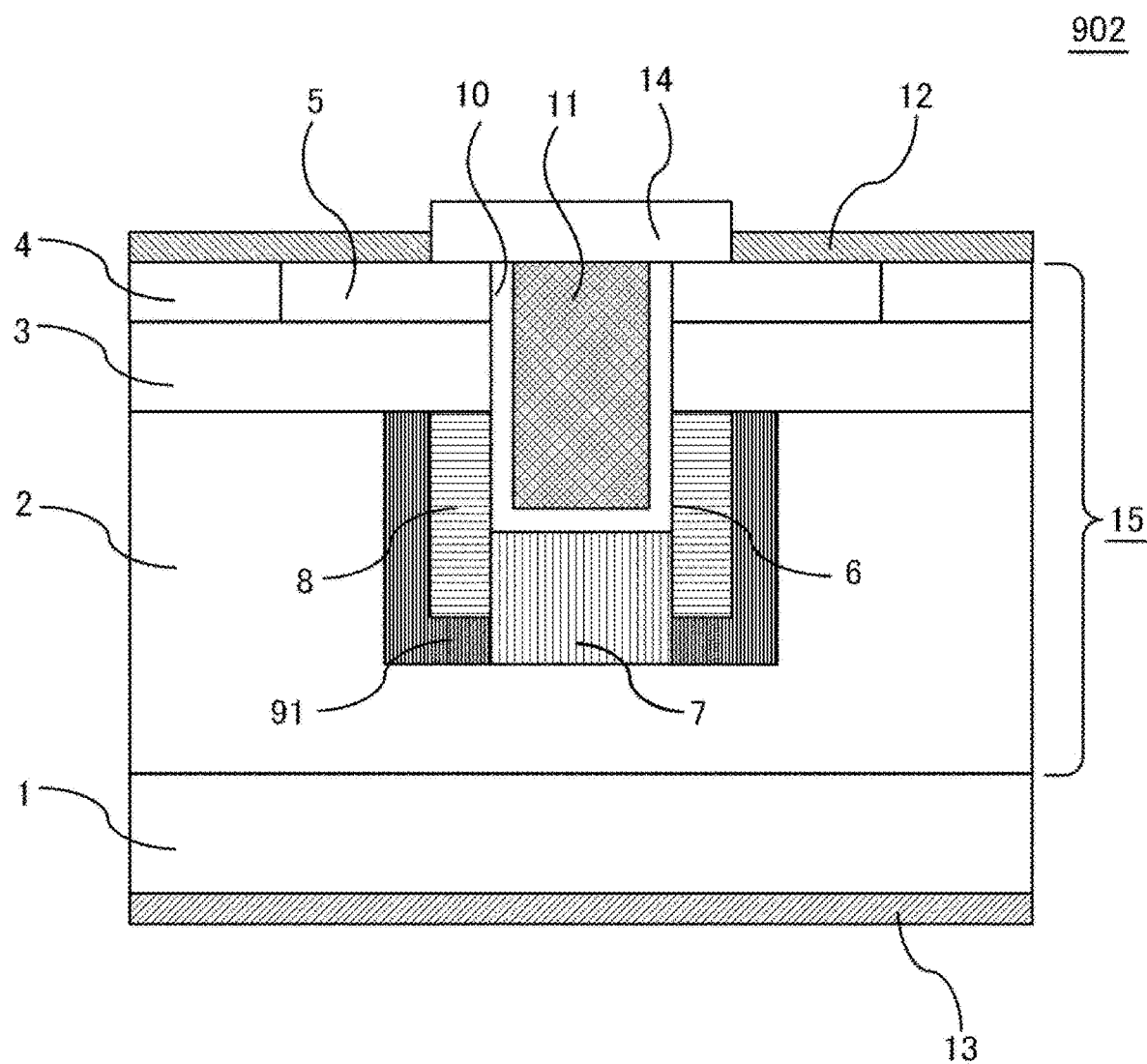

F I G. 1 4
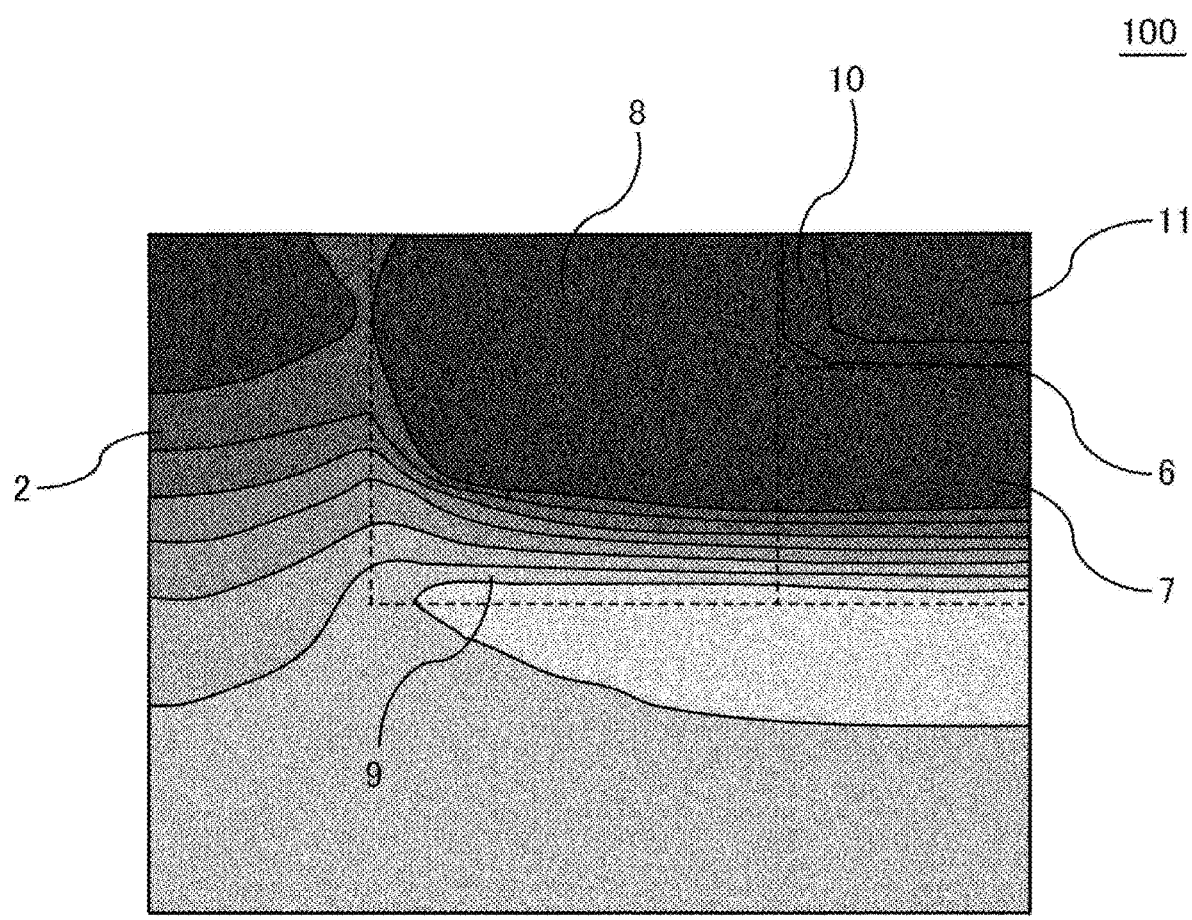

F I G. 1 8
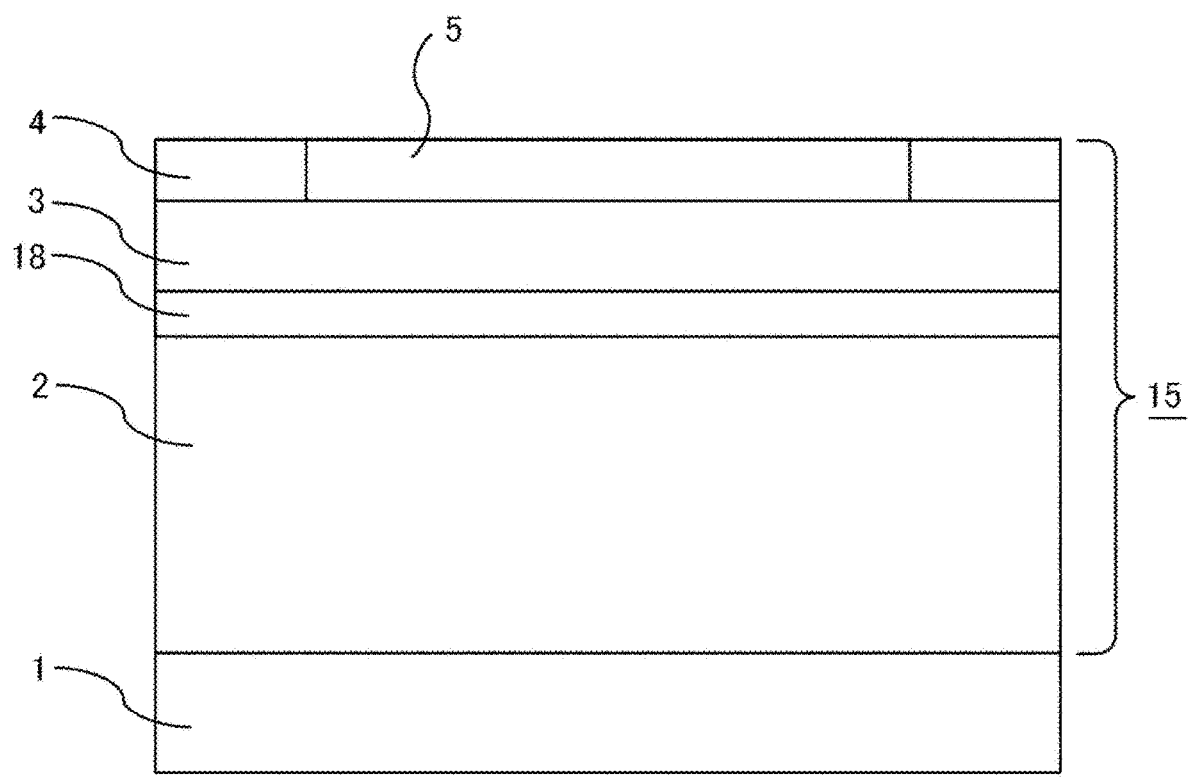

F I G. 1 9
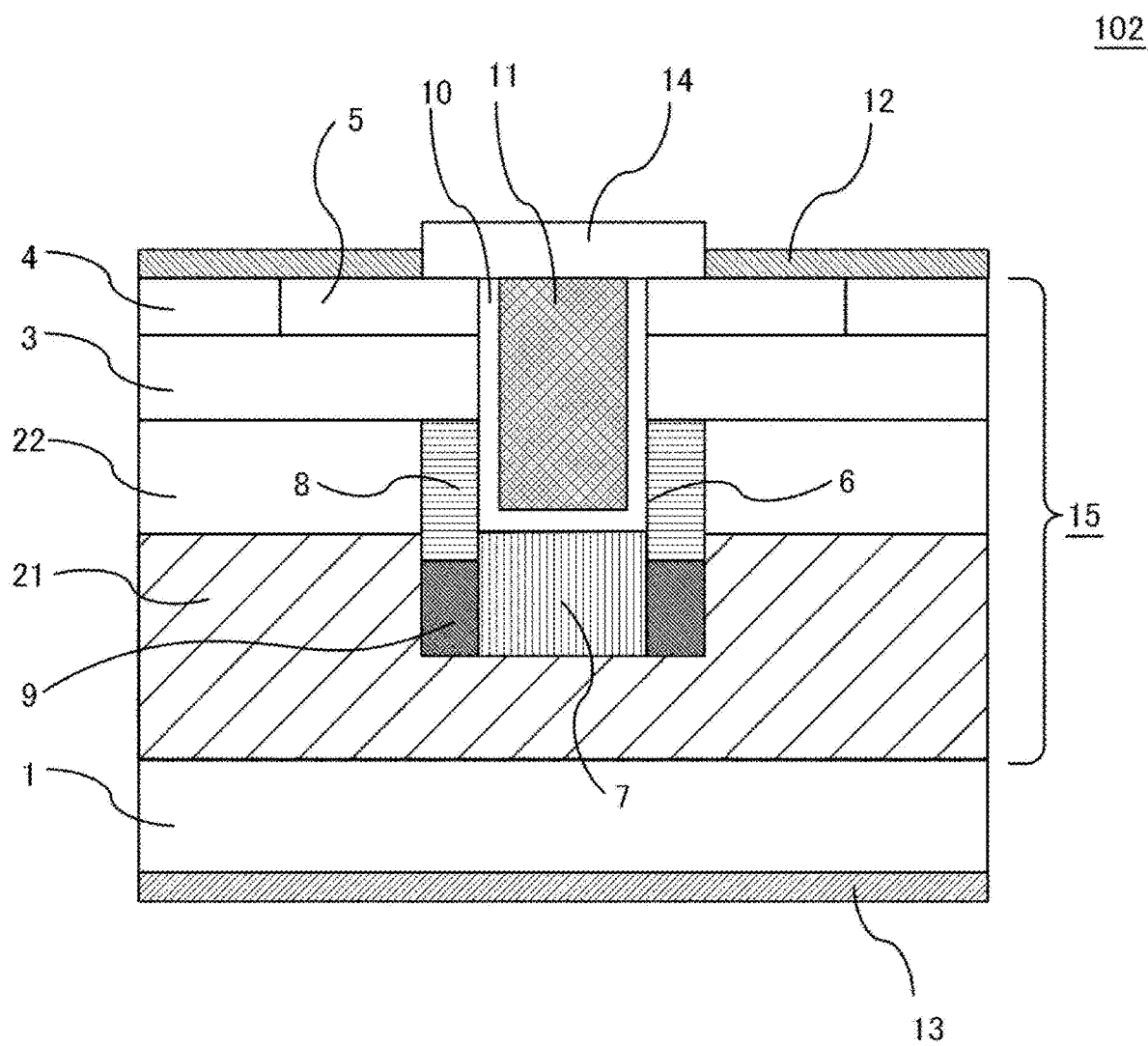

F I G. 2 0
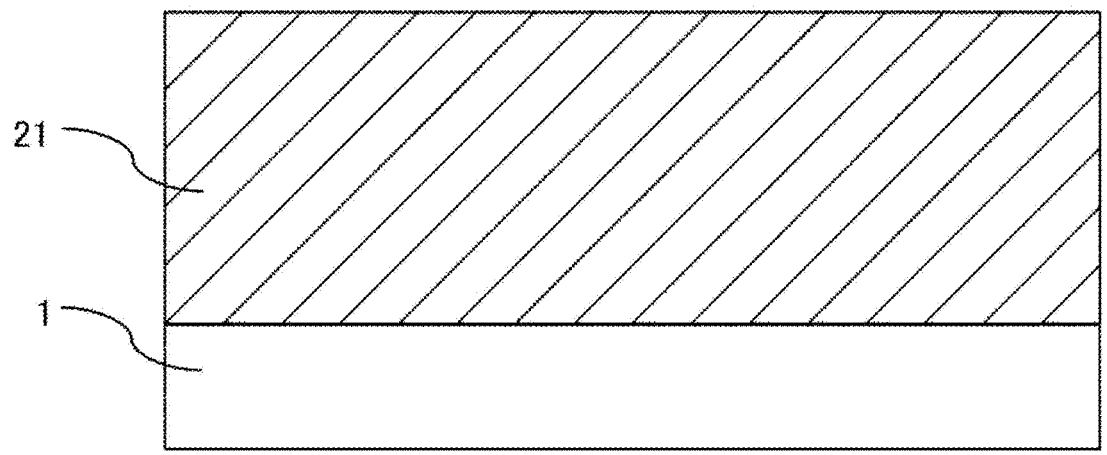

F I G. 2 5
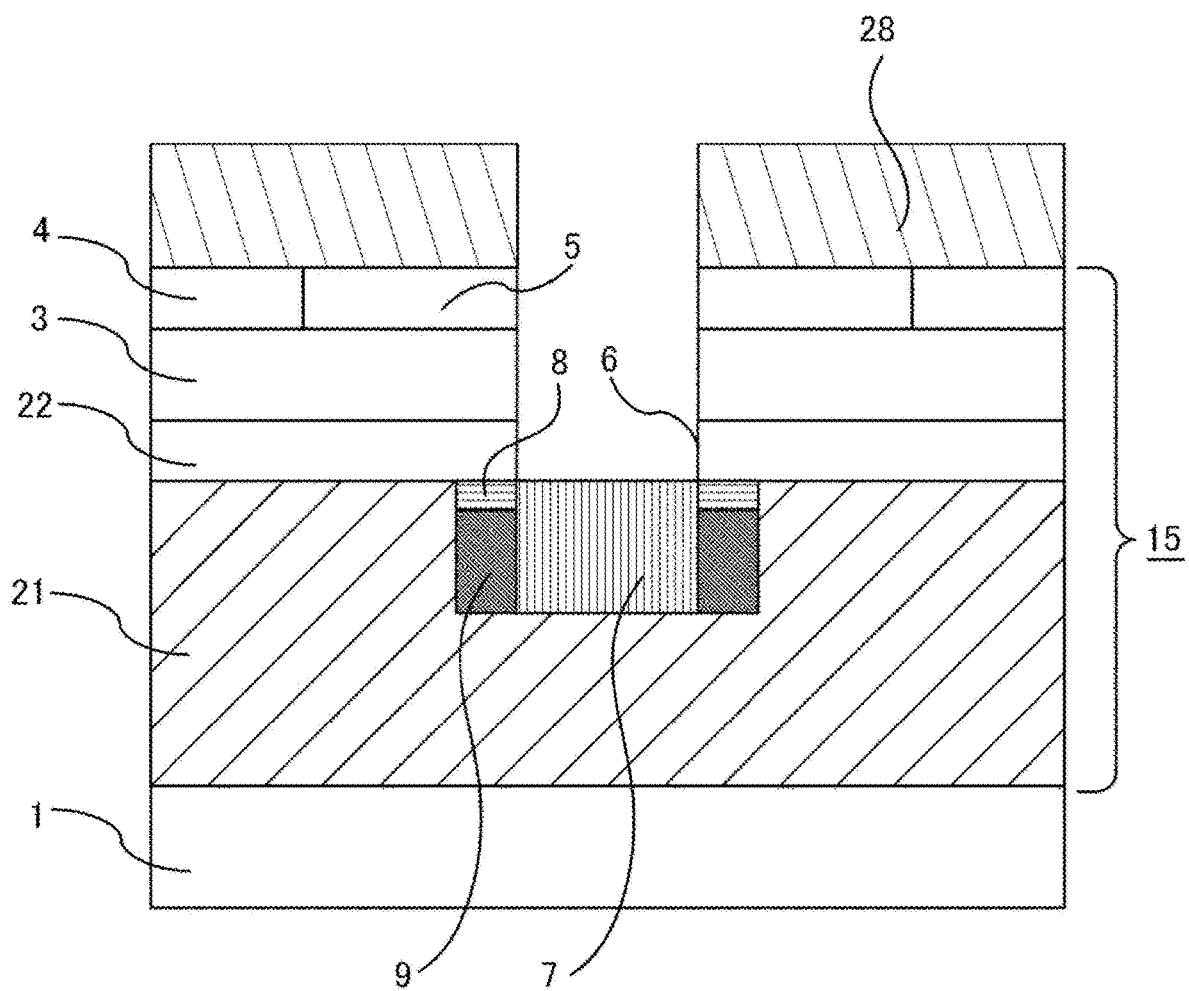

F I G. 2 6
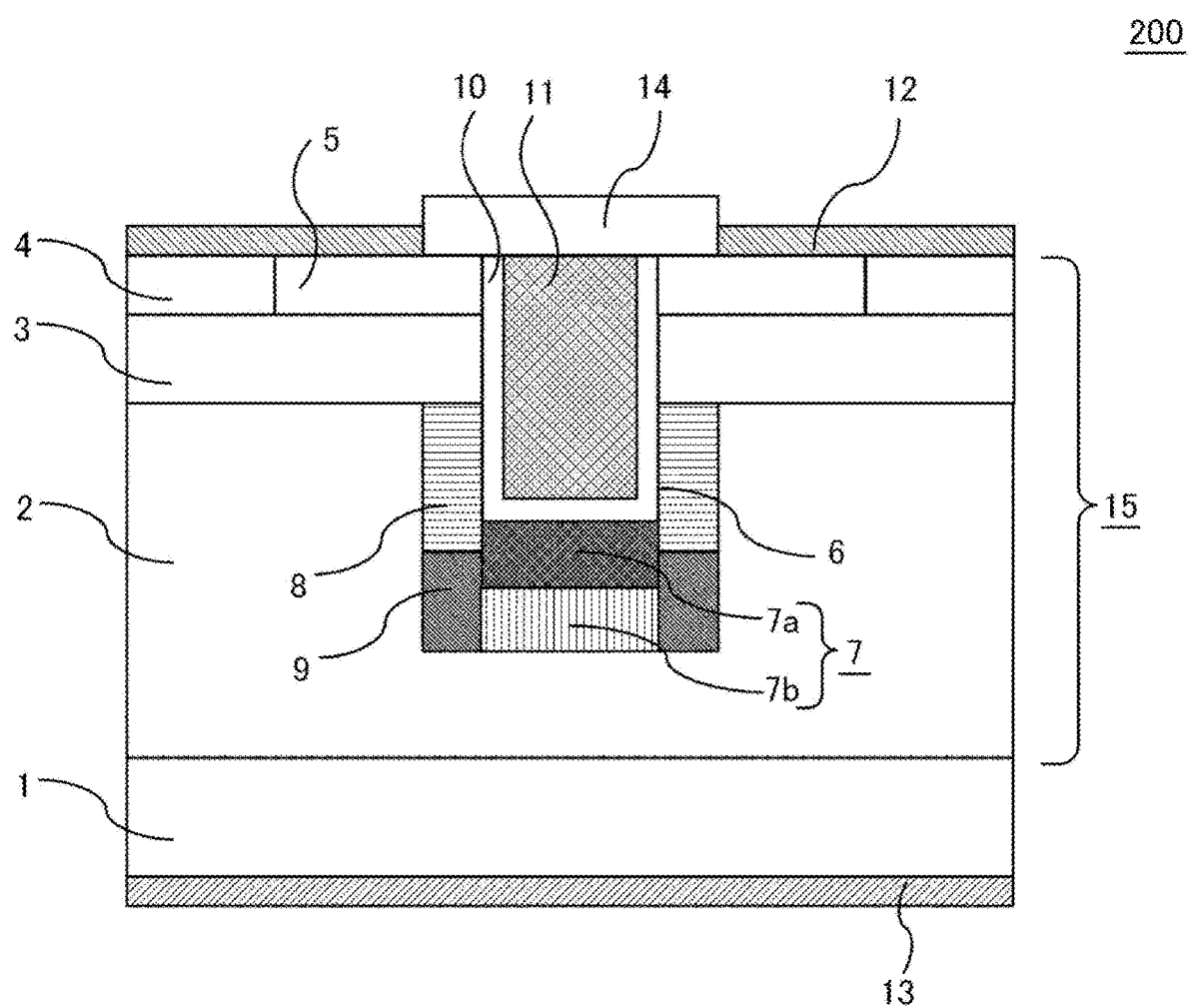

F I G. 2 7
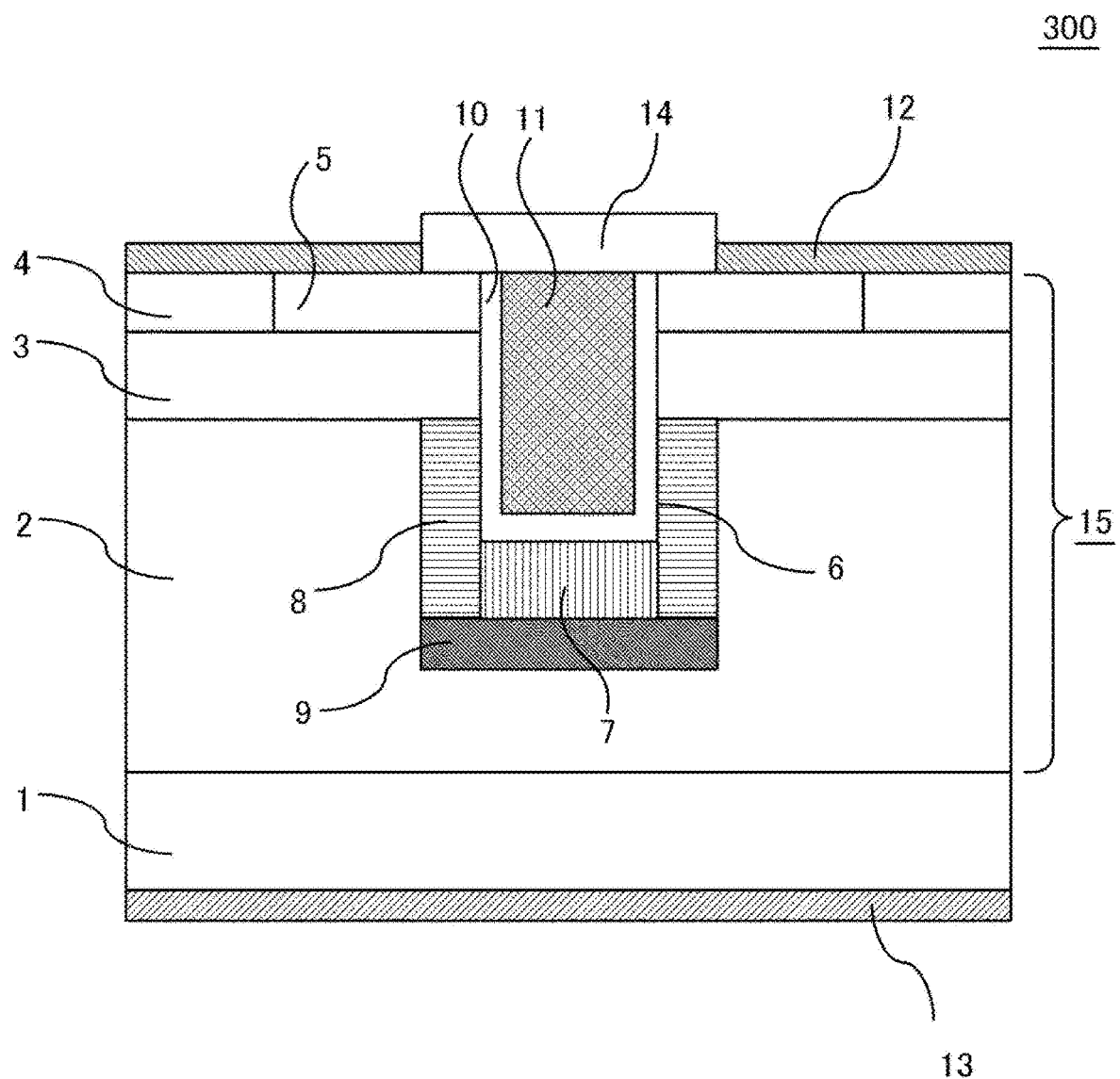

F I G. 2 8
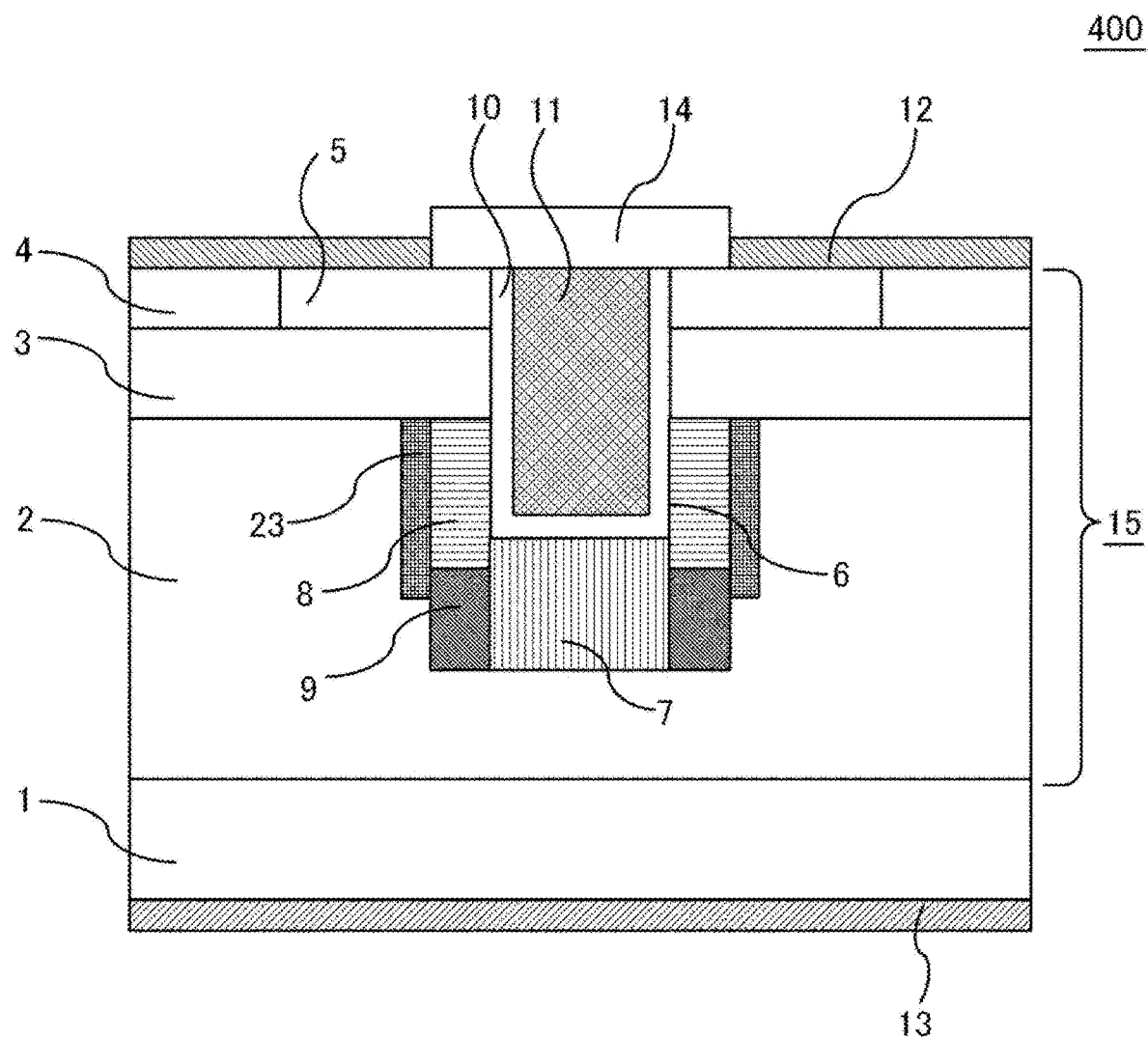

F I G. 3 0
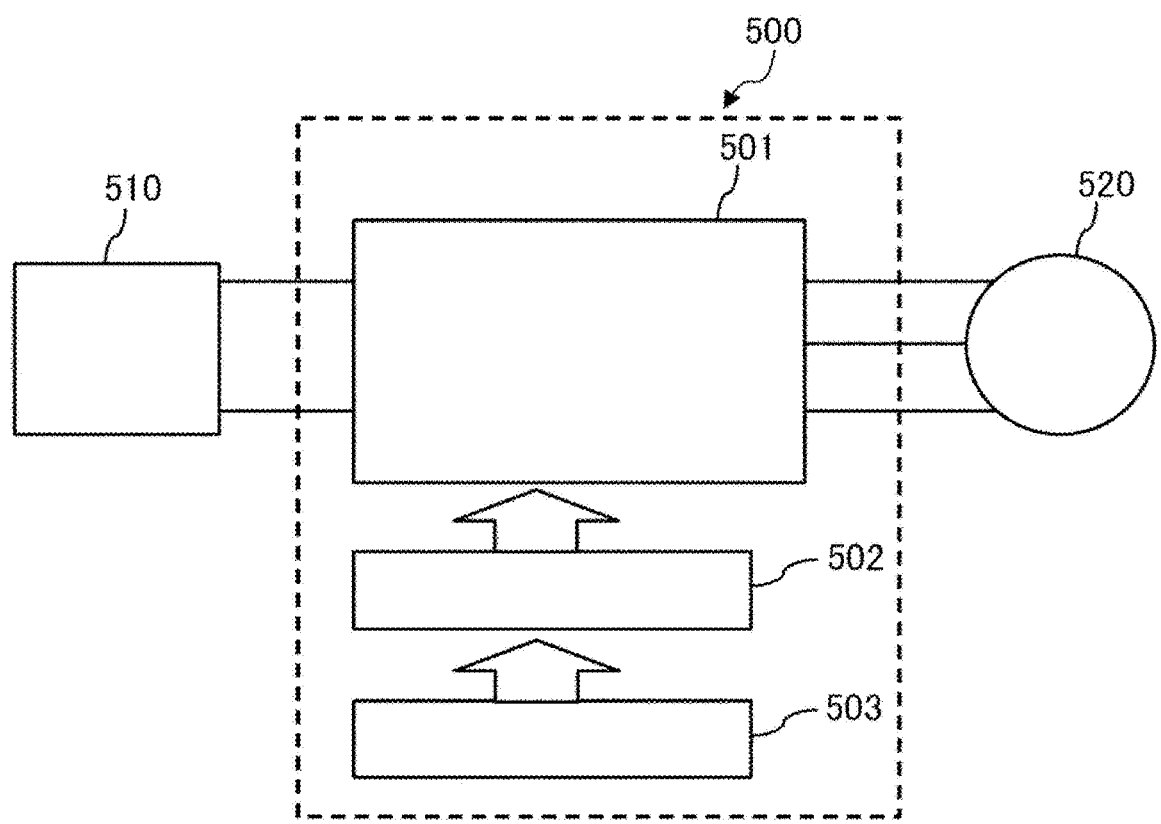

SILICON CARBIDE SEMICONDUCTOR DEVICE, POWER CONVERSION APPARATUS, AND METHOD FOR MANUFACTURING SILICON CARBIDE SEMICONDUCTOR DEVICE

CROSS-REFERENCE TO RELATED APPLICATION

The present application is based on PCT filing PCT/JP2019/046600, filed Nov. 28, 2019, the entire contents of which is incorporated herein by reference.

TECHNICAL FIELD

The present disclosure relates to a trench gate type silicon carbide semiconductor device, a power conversion apparatus to which the silicon carbide semiconductor device is applied, and a method for manufacturing the silicon carbide semiconductor device.

BACKGROUND ART

Insulated gate semiconductor devices such as metal oxide semiconductor field effect transistors (MOSFETs) and insulated gate bipolar transistors (IGBTs) are widely used as power switching elements. In the insulated gate type semiconductor device, a semiconductor device using silicon carbide (SiC) (hereinafter referred to as "silicon carbide semiconductor device") attracts attention, and a trench gate silicon carbide semiconductor device has also being developed.

In a trench gate semiconductor device, there is a problem that electric field concentration occurs at the bottom portion of the trench when a high voltage is applied in the off state of the semiconductor device. In particular, in a trench gate silicon carbide semiconductor device, since silicon carbide has high dielectric breakdown strength, gate insulating film breakdown due to electric field concentration at the bottom portion of the trench is likely to occur prior to avalanche breakdown in the drift layer, so that electric field concentration at the bottom portion of the trench tends to be a problem.

As a countermeasure against this, in order to alleviate the electric field concentration at the bottom portion of the trench, a structure is known in which a conductive protective layer different from the drift layer is provided below the trench, and a connection layer for connecting the protective layer to the source electrode is further provided lateral to the trench. However, with this configuration, there has been a problem that the electric field is concentrated in the lower part of the protective layer and the lower part of the connection layer, and the withstand voltage of the semiconductor device is deteriorated. Therefore, there is a technique of alleviating the electric field at the junction between the connection layer and the drift layer by covering the high-concentration connection layer with the low-concentration connection layer (see, for example, Patent Document 1).

PRIOR ART DOCUMENT

Patent Document

Patent Document 1: WO 2018/225600 A1

SUMMARY

Problem to be Solved by the Invention

However, in the trench gate MOSFET structure as described in Patent Document 1, since two connection layers are provided along the side surface of the trench, the width of the connection layers becomes large and the current path becomes narrow, so that there has been a problem that the JFET resistance increases when the device is turned on and this increases the on-resistance.

The present disclosure has been made to solve the above-mentioned problems, and an object of the present invention is to obtain a silicon carbide semiconductor device capable of reducing the JFET resistance when the device is turned on and reducing the on-resistance.

Means to Solve the Problem

A silicon carbide semiconductor device according to the present disclosure includes: a substrate of a first conductivity type; a drift layer of a first conductivity type made of silicon carbide provided on the substrate; a body region of a second conductivity type provided on the drift layer; a source region of a first conductivity type provided on the body region; a source electrode connected to the source region; a gate insulating film provided on an inner surface of a trench, the trench penetrating the body region and the source region and having a bottom surface positioned inside the drift layer; a gate electrode provided inside the trench with interposition of the gate insulating film; a protective layer of a second conductivity type provided below the gate insulating film; a connection layer of a second conductivity type provided inside the drift layer and being in contact with the protective layer and the body region; and an electric field relaxation layer of a second conductivity type being in contact with a bottom surface of the connection layer, provided below the connection layer, and having a lower impurity concentration of a second conductivity type than the connection layer.

Effects of the Invention

The semiconductor device according to the present disclosure has a high withstand voltage and can reduce the JFET resistance when the device is turned on by providing a wide current path, and thus has an effect that the on-resistance can be reduced.

BRIEF DESCRIPTION OF DRAWINGS

FIG. 1 is a cross-sectional view of a silicon carbide semiconductor device of a first embodiment.

FIG. 6 is a cross-sectional view showing a third step in the manufacturing steps of the silicon carbide semiconductor device of the first embodiment.

FIG. 7 is a cross-sectional view showing a fourth step in the manufacturing steps of the silicon carbide semiconductor device of the first embodiment.

FIG. 8 is a cross-sectional view for illustrating a method for forming an electric field relaxation layer in the manufacturing steps of the silicon carbide semiconductor device of the first embodiment.

FIG. 9 is a cross-sectional view for illustrating a method for forming a connection layer in the manufacturing steps of the silicon carbide semiconductor device of the first embodiment.

FIG. 11 is an example of impurity concentration profiles taken along the respective line A-A' and line B-B' in FIG. 10.

FIG. 12 is a cross-sectional view showing a silicon carbide semiconductor device of a first comparative example.

FIG. 13 is a cross-sectional view showing a silicon carbide semiconductor device of a second comparative example.

FIG. 14 is a simulation result of the electric field distribution at off time of the silicon carbide semiconductor device of the first embodiment.

FIG. 18 is a cross-sectional view showing a manufacturing step of the first modification of the silicon carbide semiconductor device of the first embodiment.

FIG. 19 is a cross-sectional view of a second modification of the silicon carbide semiconductor device of the first embodiment.

FIG. 20 is a cross-sectional view showing a first step in the manufacturing steps of the second modification of the silicon carbide semiconductor device of the first embodiment.

FIG. 25 is a cross-sectional view showing a sixth step in the manufacturing steps of the second modification of the silicon carbide semiconductor device of the first embodiment.

FIG. 26 is a cross-sectional view of a silicon carbide semiconductor device of a second embodiment.

FIG. 27 is a cross-sectional view of a silicon carbide semiconductor device of a third embodiment.

FIG. 28 is a cross-sectional view of a silicon carbide semiconductor device of a fourth embodiment.

FIG. 30 is a block diagram of a power conversion system to which a power conversion apparatus of a fifth embodiment is applied.

DESCRIPTION OF EMBODIMENTS

Figure 2:
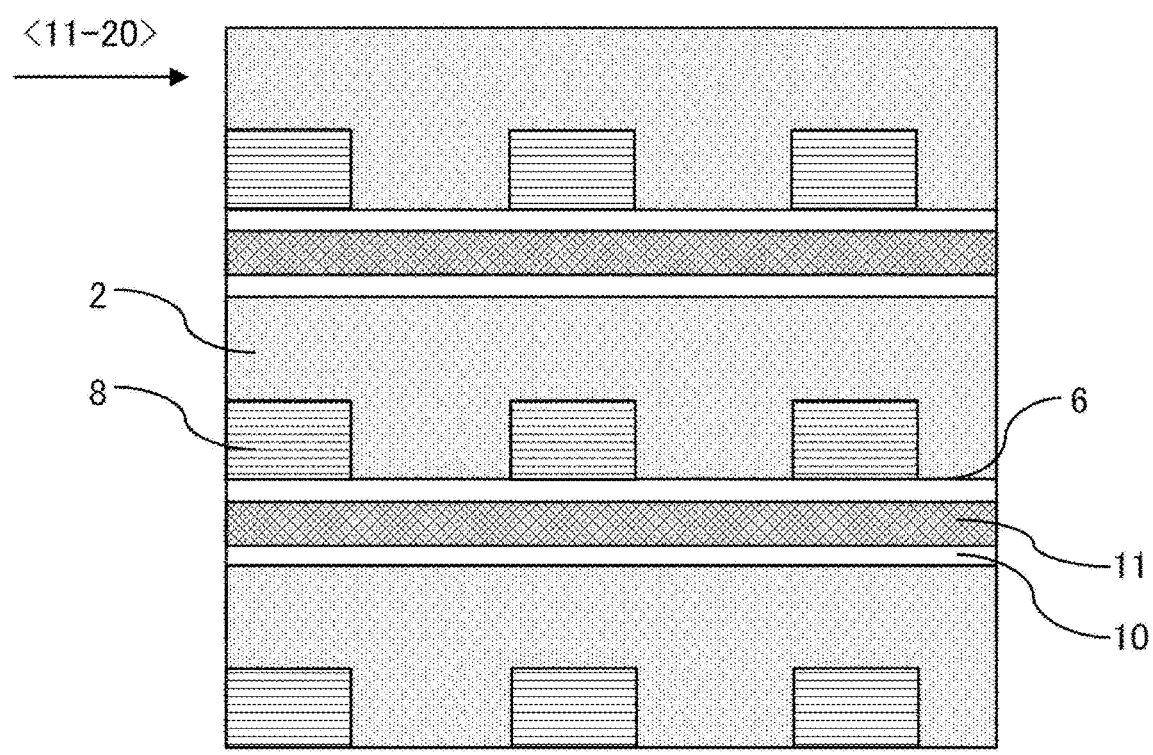
FIG. 2 is a plan view showing an example in which a trench of the silicon carbide semiconductor device of the first embodiment is formed in a stripe shape.

Hereinafter, embodiments of the present invention will be described with reference to the drawings. It should be noted that in the following drawings, the same or corresponding parts will be denoted by the same reference numerals, and description thereof will not be repeated.

In addition, in the following description, terms that mean a specific position and direction such as "upper", "lower", "side", "bottom", "front", and "back" may be used, but these terms are used to facilitate understanding of the contents of the embodiments for the sake of convenience and are not related to the direction at the time of actual implementation.

First Embodiment

The silicon carbide semiconductor device of the first embodiment will be described with reference to FIGS. 1 to 16.

First, the configuration of the silicon carbide semiconductor device 100 will be described with reference to FIG. 1. FIG. 1 is a cross-sectional view showing the silicon carbide semiconductor device 100 of the present embodiment.

It should be noted that in the present disclosure, with reference to FIG. 1, the source electrode 12 side is defined as "upper" with respect to the substrate 1 of the silicon carbide semiconductor device 100, and the drain electrode 13 side is defined as "lower" with respect to the substrate 1.

As shown in FIG. 1, the silicon carbide semiconductor device 100 includes a substrate 1, a gate electrode 11, a source electrode 12, a drain electrode 13, an interlayer insulating film 14, and a semiconductor layer 15. The semiconductor layer 15 is provided on the upper side of the substrate 1, and the drain electrode 13 is provided on the lower side of the substrate 1. In addition, a trench 6 is formed on the front surface side of the semiconductor layer 15, and a gate insulating film 10 and a gate electrode 11 are provided in the trench 6. Furthermore, on the upper side of the semiconductor layer 15, in the region on the trench 6, an interlayer insulating film 14 is provided so as to cover the gate electrode 11, and in the region where the interlayer insulating film 14 is not provided, a source electrode 12 is provided.

The substrate 1 is a silicon carbide semiconductor substrate of the first conductivity type. In addition, the semiconductor layer 15 is a semiconductor layer provided by epitaxially growing a silicon carbide semiconductor on the substrate 1. The semiconductor layer 15 includes a drift layer 2, a body region 3, a body contact region 4, and a source region 5.

The drift layer 2 is a semiconductor layer of the first conductive type provided on the substrate 1. The impurity concentration of the first conductivity type of the drift layer 2 is lower than the impurity concentration of the first conductivity type of the substrate 1. In addition, in the drift layer 2, a protective layer 7 of the second conductivity type is provided below the trench 6, a connection layer 8 is provided lateral to the trench 6, and an electric field relaxation layer 9 is provided lateral to the protective layer 7 and below the connection layer 8.

The body region 3 is a semiconductor region of the second conductivity type provided on the drift layer 2. A body contact region 4 and a source region 5 are provided on the body region 3.

The body contact region 4 is a semiconductor region of the second conductivity type provided on the body region 3. The impurity concentration of the second conductivity type in the body contact region 4 is higher than the impurity concentration of the second conductivity type in the body region 3.

The source region 5 is a semiconductor region of the first conductivity type provided adjacent to the body contact region 4 on the body region 3.

A source electrode 12 is provided on the front surface of the semiconductor layer 15 so as to be in contact with the body contact region 4 and the source region 5. The source electrode 12 is made of silicide being a compound of a metal such as nickel (Ni) or titanium (Ti) and the semiconductor layer 15, and forms ohmic contact with the body contact region 4 and the source region 5.

A drain electrode 13 is provided on the back surface of the substrate 1. The drain electrode 13 is a metal electrode made of Ni or the like.

The trench 6 is formed in the semiconductor layer 15 so that the trench 6 penetrates the source region 5 and the body region 3 from the front surface of the source region 5 and has its bottom surface positioned in the drift layer 2. A gate insulating film 10 is formed on the inner surface, that is, the bottom surface and the side surface of the trench 6, and further, a gate electrode 11 is formed to be embedded so as to be covered with the gate insulating film 10 in the trench 6.

A protective layer 7 of the second conductivity type which protects the bottom surface of the trench is formed below the trench 6. The protective layer 7 is provided so as to be in contact with the bottom portion of the trench 6 and to cover the entire bottom portion of the trench 6. The bottom portion of the trench 6 typically forms a plane, but may have a tapered shape with a tapered tip.

A connection layer 8 of the second conductivity type is provided lateral to the trench 6. The connection layer 8 is provided so as to be in contact with one side surface of the trench 6 and in contact with the body region 3 and the protective layer 7. The connection layer 8 is provided so that, from the outermost layer of the drift layer 2, its bottom surface is deeper than the bottom portion of the trench 6 and shallower than the bottom surface of the protective layer 7. It should be noted that the connection layer 8 may have a part of the side surface being in contact with the body region 3 and may have the upper surface being in contact with the source region 5 or the source electrode 12. The side surfaces of the trench 6 are typically substantially parallel, but may be taper-shaped inclined toward each other.

Since being electrically connected to the source electrode 12 through the connection layer 8, the body region 3, and the source region 5, the protective layer 7 has its potential grounded. This electrical connection is provided, for example, through adjacent cells or the like. Since the potential of the protective layer 7 is grounded, the depletion layer is likely to spread from the protective layer 7 toward the drift layer 2 when the silicon carbide semiconductor device 100 is turned off.

An electric field relaxation layer 9 of the second conductivity type is provided below the connection layer 8. The electric field relaxation layer 9 is provided so as to be in contact with the bottom surface of the connection layer 8 and in contact with one side surface of the protective layer 7. The bottom surface of the electric field relaxation layer 9 is provided so that the depth from the outermost layer of the drift layer 2 to the bottom surface of the electric field relaxation layer 9 is substantially the same as the depth to the bottom surface of the protective layer 7. In addition, the impurity concentration of the second conductivity type of the electric field relaxation layer 9 is lower than the impurity concentration of the second conductivity type of the connection layer 8.

It should be noted that the protective layer 7 is not limited to the one provided in contact with the bottom portion of the trench 6, and may be provided in the drift layer 2 so as to be separated below the bottom portion of the trench 6. In addition, the protective layer 7 is not limited to the one covering the entire bottom portion of the trench 6, and may be provided so as to cover at least a part of the bottom portion of the trench 6. For example, the protective layer 7 may be periodically arranged at intervals along the extending direction of the trench 6 (in the case of a striped shape, the longitudinal direction in a plan view, and in the case of a grid shape, the direction is defined for each trench 6), or may be provided so as to cover about half of the bottom portion of the trench 6 in a cross section orthogonal to the extending direction. Alternatively, the protective layer 7 may be configured so that the width of the protective layer 7 is larger than the width of the trench 6 by covering the entire bottom portion so as to protrude in the width direction of the trench 6.

The protective layer 7 is not limited to the one provided along the extending direction of the trench 6, and the bottom portion of the trench 6 may be partially and periodically covered in the extending direction by extending the protective layer 7 in a direction orthogonal to the extending direction of the trench 6 and providing a plurality of protective layers 7.

The connection layer 8 is not limited to the one provided in contact with the entire one side surface of the trench 6, and may be provided in contact with at least a part of at least one side surface of the trench 6. The connection layer 8 may be provided in the drift layer 2 at a position away from the side surface of the trench 6. In addition, the connection layer 8 is not limited to the one in which, from the outermost layer of the drift layer 2, the bottom surface of the connection layer 8 is deeper than the bottom portion of the trench 6 and shallower than the bottom portion of the protective layer 7, and has only to be provided so as to be in contact with the body region 3 and the protective layer 7 and electrically connect them. For example, the connection layer 8 may be provided so that, from the outermost surface layer of the drift layer 2, the depth of the bottom surface of the connection layer 8 is the same as that of the bottom surface of the protective layer 7, or the bottom surface of the connection layer 8 may be provided near the upper surface of the protective layer 7.

The connection layer 8 may be provided between the adjacent trenches 6 in the drift layer 2 in parallel with the extending direction of the trench 6. In this case, the connection layer 8 is not limited to the one provided linearly and continuously, and may be provided periodically at intervals in the extending direction of the trench 6.

In addition, in the silicon carbide semiconductor device 100 shown in FIG. 1, connection layers 8 are provided on both sides of the first side surface 6a of the trench 6 and the second side surface 6b opposite to the first side surface 6a across the trench 6, but the present invention is not limited to this. That is, in a plan view parallel to the device front surface, the connection layer 8 and the electric field relaxation layer 9 may be formed on any one of the first side surface 6a and the second side surface of the trench 6, or may be formed on both sides of the first side surface 6a and the second side surface 6b.

When the connection layer 8 includes connection layers 8, the electric field relaxation layer 9 includes electric field relaxation layers 9, and the connection layers 8 and the electric field relaxation layers 9 are formed on both sides of the first side surface 6a and the second side surface 6b, one of the connection layers 8 and one of the electric field relaxation layers 9 formed on the first side surface 6a side and the other of the connection layers 8 and the other of the electric field relaxation layers 9 formed on the second side surface 6b side may be formed so as to face each other across the trench 6, or may be alternately formed so as not to face each other across the trench 6.

Figure 3:
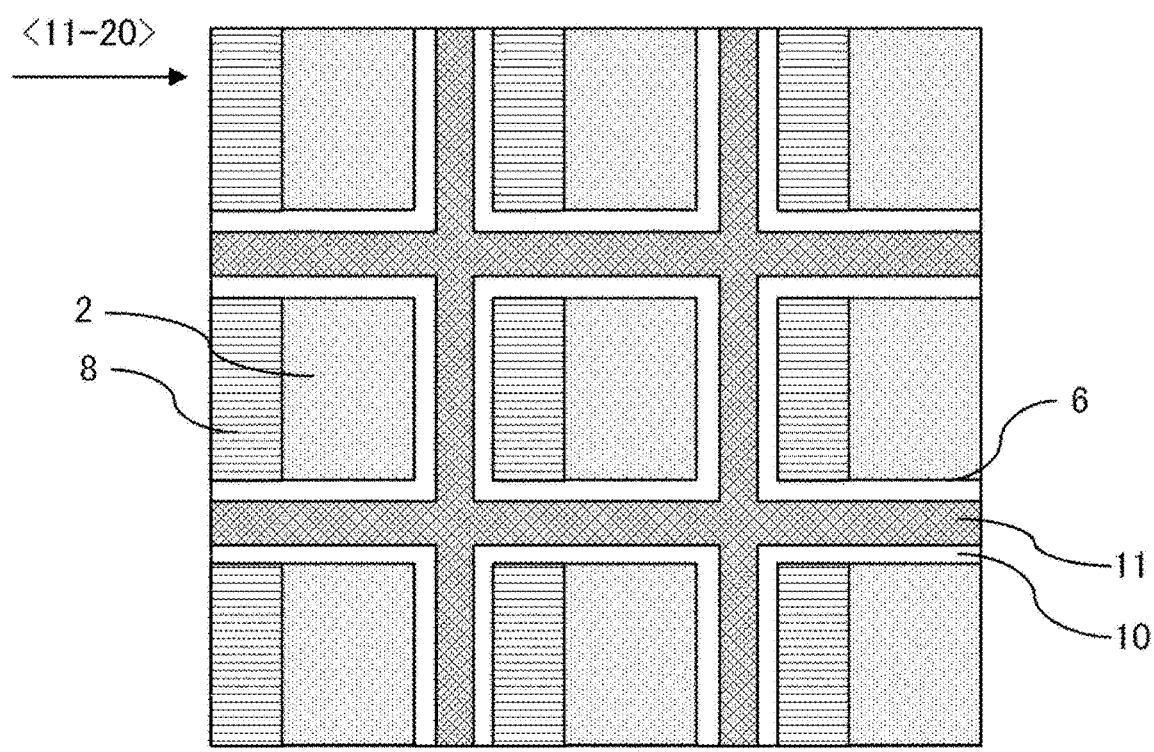
FIG. 3 is a plan view showing an example in which a trench of the silicon carbide semiconductor device of the first embodiment is formed in a grid shape.

Here, a specific example will be described with reference to FIGS. 2 and 3 when the connection layer 8 and the electric field relaxation layer 9 are formed on any one of the first side surface 6a and the second side surface of the trench 6. FIGS. 2 and 3 are plan views at the position where the trench 6 and the connection layer 8 are formed below the body region 3 in the silicon carbide semiconductor device.

In the structure shown in FIG. 2, the trench 6 is arranged in a stripe shape, and the connection layers 8 are formed on one side of the two side surfaces of the trench 6 and are formed apart from each other along the extending direction of the trench 6.

When the trench 6 is arranged in a stripe shape and the substrate 1 made of silicon carbide is provided with an off angle, it is desirable that the extending direction of the stripe is the same direction as the off angle of the substrate 1. For example, when the <0001> crystal axis of substrate 1 is tilted by an off angle of a few degrees towards the <11-20> crystal axis, it is desirable that the stripes of the trench 6 are parallel to the <11-20> crystal axis, that is, the side surface of the trench 6 is a surface nearly close to the (1-100) plane and the (-1100) plane. Thus, the anisotropy of the electrical characteristics due to the off angle does not affect between the first side surface, and the second side surface opposite to the first side surface, of the trench 6, so that the variation in the characteristics of the channels formed on each side surface can be reduced.

In addition, in the structure shown in FIG. 3, the trench 6 is arranged in a grid shape, and the connection layer 8 is provided so as to be in contact with one of the four sides constituting each grid. It should be noted that the length where the connection layer 8 is in contact with one side of the grid is the same as the length of one side of the grid formed by the trench 6 in FIG. 3, but may be smaller than the length of one side.

When the trench 6 is arranged in a grid shape and the substrate 1 is provided with an off angle, it is desirable that the connection layer 8 is provided on the side surface of the trench 6 orthogonal to the direction in which the off angle is provided. On the four side surfaces of the trench 6 parallel to the four sides constituting each grid, since the characteristics of the channels formed on the two side surfaces parallel to the direction in which the off-angle is provided have little variation, but the channel characteristics deteriorate on the side surface orthogonal to the direction in which the off-angle is provided, stable channel characteristics can be obtained during device operation by providing the connection layer 8 on this side surface to disable the channels in the region.

It should be noted that the structure of the trench 6 is not limited to the above-described stripe shape or grid shape, and may be a substantial circle, a substantially polygonal cell, or an arrangement divided in the stripe extending direction.

Next, the impurity concentration of each layer and each region constituting the silicon carbide semiconductor device 100 will be described.

The impurity concentration of the first conductivity type of the drift layer 2 is $1.0\times10^{14}$ to $1.0\times10^{17}$ cm$^{-3}$, which is appropriately set based on the specifications such as the withstand voltage of the silicon carbide semiconductor device 100. It is assumed that the impurity concentration of the first conductivity type of the drift layer 2 is lower than the impurity concentration of the first conductivity type of the substrate 1.

The impurity concentration of the second conductivity type of the body region 3 is $1.0\times10^{14}$ to $1.0\times10^{18}$ cm$^{-3}$.

The impurity concentration of the second conductivity type of the body contact region 4 is $1.0\times10^{18}$ to $1.0\times10^{21}$ cm$^{-3}$, and the impurity concentration of the second conductivity type is assumed to be higher than that of the body region 3 in order to reduce the contact resistance with the source electrode 12.

The impurity concentration of the first conductivity type of the source region 5 is $1.0\times10^{18}$ to $1.0\times10^{21}$ cm$^{-3}$, which is higher than the impurity concentration of the first conductivity type of the drift layer 2.

The impurity concentration of the second conductivity type of the protective layer 7 is preferably $1.0\times10^{14}$ to $1.0\times10^{20}$ cm$^{-3}$, and the concentration profile does not have to be uniform.

The impurity concentration of the second conductivity type of the connection layer 8 is $1.0\times10^{14}$ to $1.0\times10^{20}$ cm$^{-3}$.

The impurity concentration of the second conductivity type of the electric field relaxation layer 9 is lower than the impurity concentration of the second conductivity type of the connection layer 8. In addition, it is desirable that the impurity concentration of the second conductivity type of the electric field relaxation layer 9 is lower than the impurity concentration of the second conductivity type of the protective layer 7.

At the boundary between the connection layer 8 and the electric field relaxation layer 9, there may be a steep difference in impurity concentration, or the impurity concentration may change gently. From the connection layer 8 to the electric field relaxation layer 9, when there is a position where the impurity concentration sharply changes, or when there is a position where the gradient becomes larger than the gradient in the vicinity at a certain distance while the concentration gradient with respect to the distance gradually changes when the impurity concentration is plotted against the distance from the bottom surface of the body region 3, the position where the large concentration difference occurs is defined as the boundary between the connection layer 8 and the electric field relaxation layer 9. In addition, when the impurity concentration gently decreases from near the lower part of the connection layer 8 to the electric field relaxation layer 9, the position where the impurity concentration is half of the maximum value of the impurity concentration of the connection layer 8 is defined as the boundary between the connection layer 8 and the electric field relaxation layer 9.

Next, the operation of the silicon carbide semiconductor device 100 will be briefly described.

In FIG. 1, when a voltage equal to or higher than the threshold voltage is applied to the gate electrode 11, in the body region 3, a channel of the inverted conductivity type, that is, of the first conductivity type is formed along the side surface of the trench 6. Then, since a current path of the same conductivity type is formed between the source electrode 12 and the drain electrode 13, a current flows. As described above, the state in which a voltage equal to or higher than the threshold voltage is applied to the gate electrode 11 is the ON state of the silicon carbide semiconductor device 100.

On the other hand, when a voltage equal to or lower than the threshold voltage is applied to the gate electrode 11, since no channel is formed in the body region 3, a current path as in the case of the ON state is not formed. Therefore, even when a voltage is applied between the drain electrode 13 and the source electrode 12, almost no current flows from the drain electrode 13 to the source electrode 12. As described above, the state in which the voltage of the gate electrode 11 is equal to or lower than the threshold voltage is the OFF state of the silicon carbide semiconductor device 100. Then, the silicon carbide semiconductor device 100 operates to switch between the ON state and the OFF state by controlling the voltage applied to the gate electrode 11.

Next, a method for manufacturing the silicon carbide semiconductor device 100 will be described with reference to FIGS. 4 to 9. FIGS. 4 to 9 are cross-sectional views showing each step of the method for manufacturing the silicon carbide semiconductor device 100.

Figure 4:
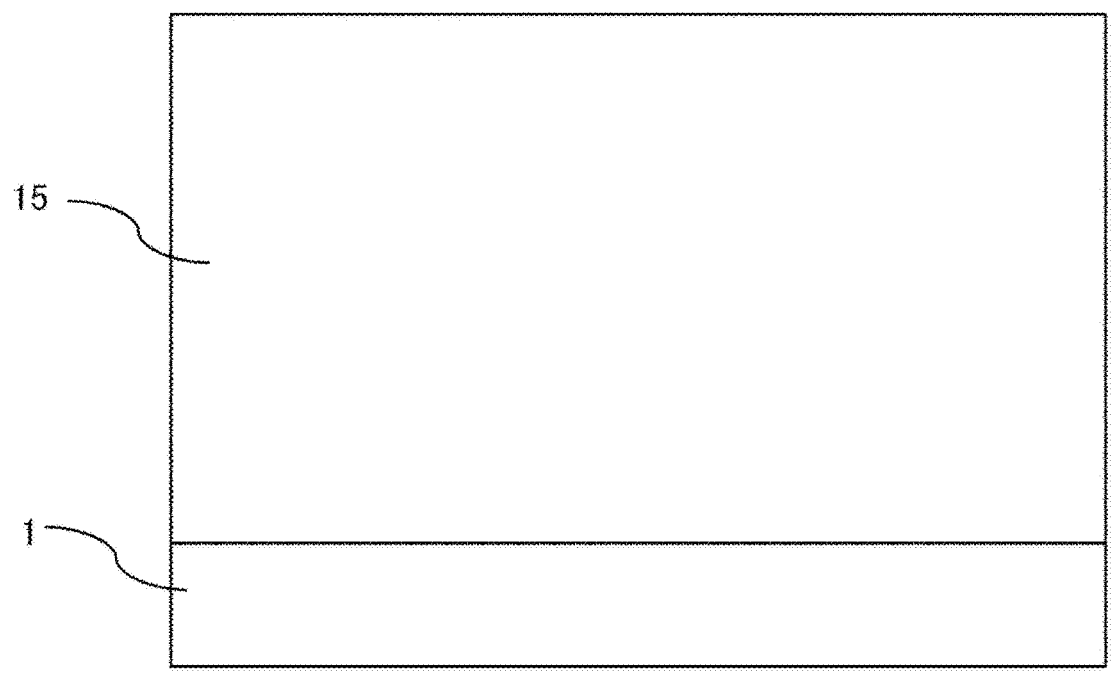
FIG. 4 is a cross-sectional view showing a first step in the manufacturing steps of the silicon carbide semiconductor device of the first embodiment.

As shown in FIG. 4, a semiconductor layer 15 of the first conductivity type made of silicon carbide is formed on the substrate 1. Specifically, the semiconductor layer 15 of the first conductivity type has only to be formed by epitaxial crystal growth on the substrate 1 being a silicon carbide substrate of the first conductivity type. In addition, the impurity concentration of the first conductivity type in the semiconductor layer 15 is formed so as to correspond to the impurity concentration of the first conductivity type in the drift layer 2 described above.

Figure 5:
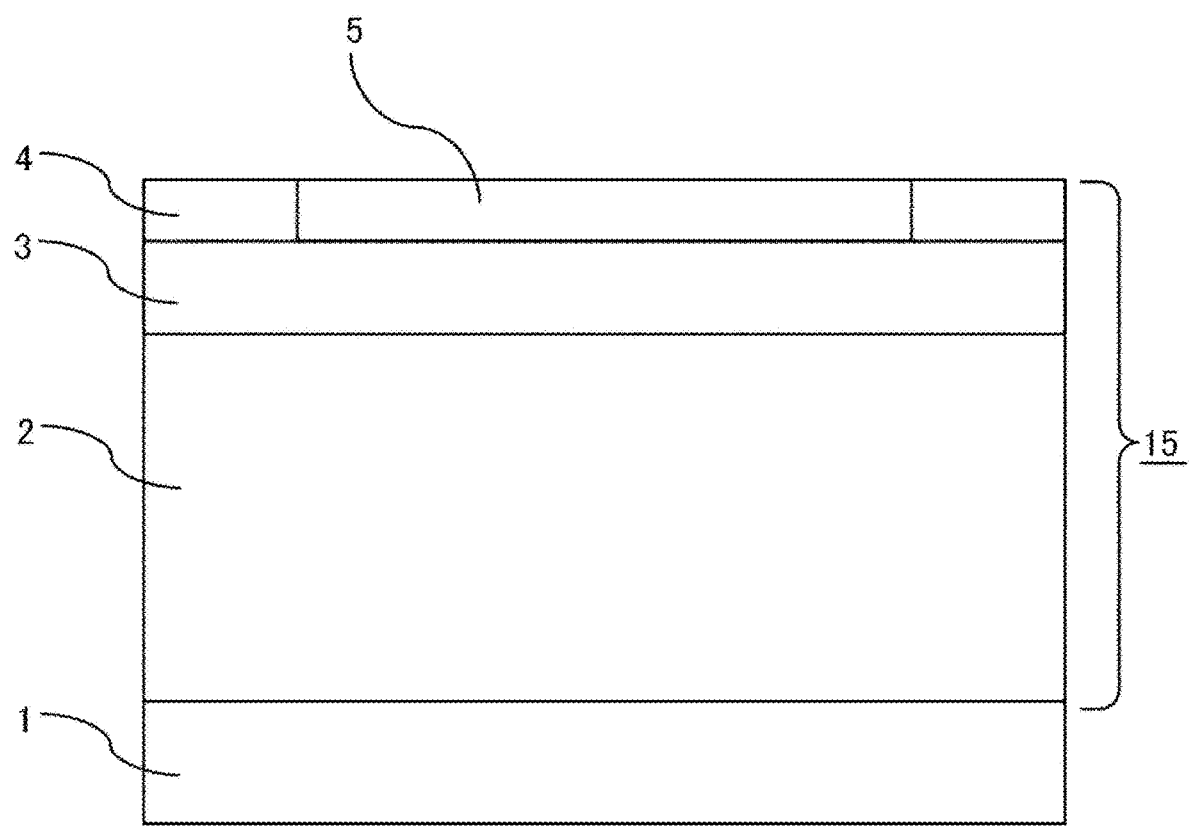
FIG. 5 is a cross-sectional view showing a second step in the manufacturing steps of the silicon carbide semiconductor device of the first embodiment.

As shown in FIG. 5, a body region 3, a body contact region 4, and a source region 5 are each formed in the upper part of the semiconductor layer 15 by ion implantation. When, for example, an n-type region is formed as the first conductivity type region, ions such as N (nitrogen) or P (phosphorus) are implanted as donor ions. In addition, when, for example, a p-type region is formed as the second conductivity type region, ions such as Al (aluminum) or B (boron) are implanted as acceptor ions. Each region is formed so that the impurity concentration is included within the range of the above-described values. It should be noted that the order of forming each region may be reversed. In addition, at least a part of the region can be formed by epitaxial crystal growth instead of ion implantation.

As shown in FIG. 6, a mask 16 having an opening is formed on the semiconductor layer 15. Then, by reactive ion etching (RIE) using this mask 16, a trench 6 is formed penetrating the source region 5 and the body region 3 from the front surface of the source region 5 to reach the inside of the drift layer 2.

As shown in FIG. 7, the protective layer 7 is formed by implanting second conductivity type ions into the bottom surface of the trench 6. As shown in FIG. 7, formation of the protective layer 7 may be performed by using the mask 16 having an opening, or a mask may be separately formed. It should be noted that the protective layer 7 can also be formed by forming the trench 6 deeper by the thickness of the protective layer 7 and then forming the protective layer 7 in the trench 6 by epitaxial crystal growth.

As shown in FIG. 8, ion-implanting, with the implantation energy E2, the acceptor ion dose amount N2 with a slant of an angle $\theta 2$ from the direction perpendicular to the front surface of the semiconductor layer 15 toward the side surface of the trench 6 forms the electric field relaxation layer 9 of the second conductivity type.

As shown in FIG. 9, ion-implanting, with the ion implantation energy E1, the acceptor ion dose amount N1 that is higher than the acceptor ion dose amount N2 with a slant of an angle $\theta 1$ larger than the angle $\theta 2$ from the direction perpendicular to the front surface of the semiconductor layer 15 toward the side surface of the trench 6 forms the connection layer 8 of the second conductivity type having a higher impurity concentration than the electric field relaxation layer 9.

As described above, in the steps shown in FIGS. 8 and 9, making the implantation angle $\theta 1$ larger than $\theta 2$ allows the electric field relaxation layer 9 to be formed below the connection layer 8. Furthermore, setting the ion implantation energy E1 to E2 or higher allows the electric field relaxation layer 9 to be locally formed in a region equal to or lower than the bottom surface without being in contact with the side surface of the connection layer 8 so that the width of the electric field relaxation layer 9 is equal to or less than the width of the connection layer 8. Here, the width of the electric field relaxation layer 9 and the width of the connection layer 8 mean the width of the electric field relaxation layer 9 and the width of the connection layer 8 in the width direction of the trench 6, respectively.

It should be noted that at the time of slanted ion implantation, the mask 16 may be used or may be removed. In any one of the cases, the implantation angle of the slanted ion implantation is preferably equal to or smaller than the angle formed by the diagonal from the upper end of one side surface of the mask 16 or the trench 6 to the lower end of the opposing side of the trench 6, and the side surface. By doing so, the connection layer 8 and the electric field relaxation layer 9 can be formed around the trench 6 and the protective layer 7.

In addition, the connection layer 8 and the electric field relaxation layer 9 can also be formed by epitaxial crystal growth, vertical ion implantation, or a combination thereof. In this case, the region from the lower part of the body region 3 to the lower part of the trench 6 or the lower part of the protective layer 7 may be a semiconductor layer formed by individual epitaxial crystal growth. In addition, the electric field relaxation layer 9 may be formed in the lower part of the protective layer 7.

Figure 10:
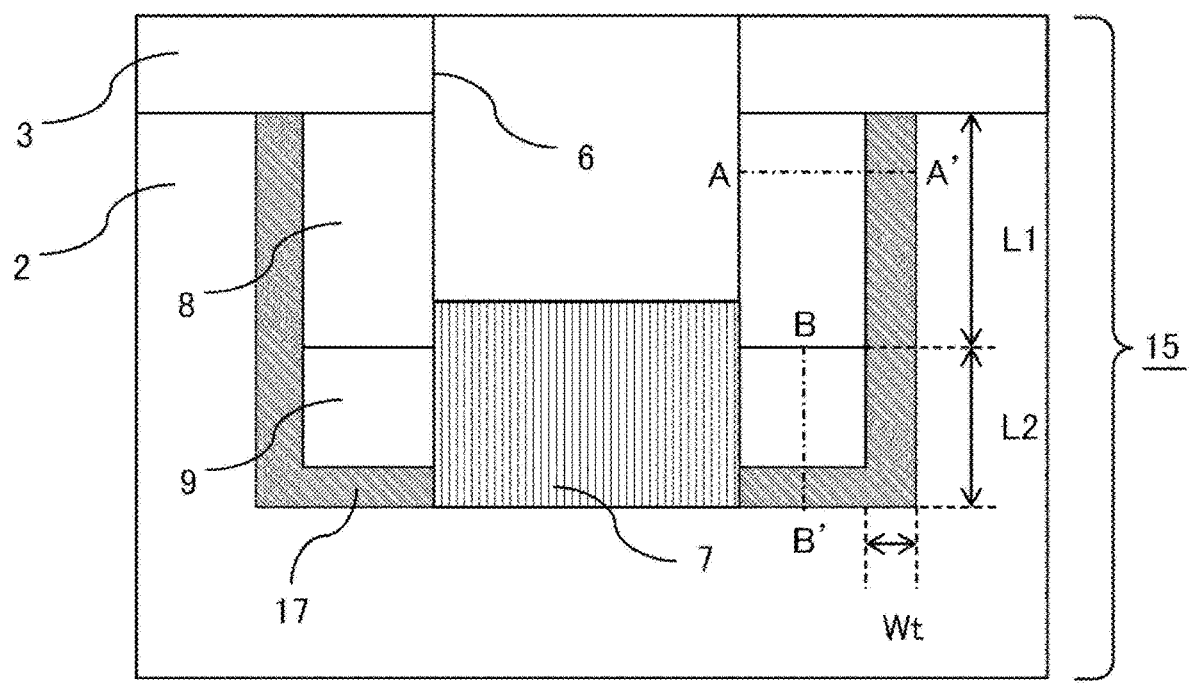
FIG. 10 is a cross-sectional view of a main part of the silicon carbide semiconductor device of the first embodiment.

Here, the connection layer 8 and the electric field relaxation layer 9 will be described in detail with reference to FIGS. 10 and 11. FIG. 10 is an enlarged view of a region from the body region 3 to the drift layer 2 in the lower part of the protective layer 7 in the same structure as in FIG. 9 when the connection layer 8 and the electric field relaxation layer 9 are formed by ion implantation. In addition, FIG. 11 is an example of second conductivity type impurity concentration profiles taken along the respective line A-A' and line B-B' in FIG. 10.

When the connection layer 8 is formed by slanted ion implantation, as shown in FIG. 10, the tail region 17 in which the impurity concentration gradually decreases toward the ion implantation direction is formed on the bottom surface of the electric field relaxation layer 9 and the side surfaces on the drift layer 2 side of the connection layer 8 and the electric field relaxation layer 9. The attenuation of the impurity concentration of the tail region 17 can be approximated by the Gaussian distribution, as shown in FIG. 11. The width Wt of the tail region 17 formed on the side surface on the drift layer 2 side of the connection layer 8 and the electric field relaxation layer 9 is smaller than the length L2 in the device longitudinal direction of the electric field relaxation layer 9 including the tail region 17. Therefore, it is possible to distinguish the tail region 17 generated by ion implantation from the electric field relaxation layer 9 having a lower impurity concentration than the connection layer 8.

Return to the description of the manufacturing method. Thereafter, the gate insulating film 10 is formed on the bottom surface and the side surface in the trench 6, and the gate electrode 11 is formed with interposition of the gate insulating film 10 so as to be embedded in the trench 6. Then, after the interlayer insulating film 14 is formed so as to cover the gate electrode 11, the source electrode 12 is formed so as to be in contact with the front surface of the source region 5 and the front surface of the body contact region 4, and the drain electrode 13 is formed on the back surface of the substrate 1.

Through the above steps, the silicon carbide semiconductor device 100 shown in FIG. 1 is completed.

The effect of the silicon carbide semiconductor device 100 configured thus will be described.

In the silicon carbide semiconductor device 100, since the connection layer 8 connecting the protective layer 7 and the body region 3 is formed, the protective layer 7 can be electrically connected to the source electrode 12 connected to the body region 3 with interposition of the body contact region 4. Thus, the charge to the source electrode 12 is extracted during device switching, so that the response of the depletion layer becomes faster and the switching loss can be reduced. Furthermore, by connecting the protective layer 7 to the source potential, the elongation of the depletion layer is promoted from the protective layer 7 toward the drift layer 2 when the device is turned off, and as a result, the electric field strength at the bottom surface of the trench 6 can be reduced.

Here, the effect of the electric field relaxation layer 9 being locally formed in the lower part of the connection layer 8 will be described with reference to FIGS. 1 and 12 to 16. FIGS. 12 and 13 are cross-sectional views showing silicon carbide semiconductor devices 901 and 902 according to comparative examples with respect to the silicon carbide semiconductor device 100. In addition, FIGS. 14 to 16 respectively show the electric field distributions of the silicon carbide semiconductor devices 100, 901, and 902 calculated by simulation when they are turned off.

First, the difference in configuration between the silicon carbide semiconductor device 100 and the silicon carbide semiconductor devices 901 and 902 according to the comparative examples will be described.

In the silicon carbide semiconductor device 100 shown in FIG. 1, an electric field relaxation layer 9 is provided below the connection layer 8. On the other hand, the silicon carbide semiconductor device 901 according to the first comparative example shown in FIG. 12 is different in that the electric field relaxation layer 9 is not provided and the bottom surface of the connection layer 8 is in contact with the drift layer 2.

In addition, in the silicon carbide semiconductor device 100 shown in FIG. 1, the side surface opposite to the trench 6 of the connection layer 8 is in contact with the drift layer 2. On the other hand, the silicon carbide semiconductor device 902 according to the second comparative example shown in FIG. 13 is different in that a second connection layer 91 having a lower impurity concentration than the connection layer 8 is formed so as to cover the side surfaces and the bottom surface of the connection layer 8.

Next, the electric field distribution when the silicon carbide semiconductor devices 100, 901, and 902 are turned off will be described.

Figure 15:
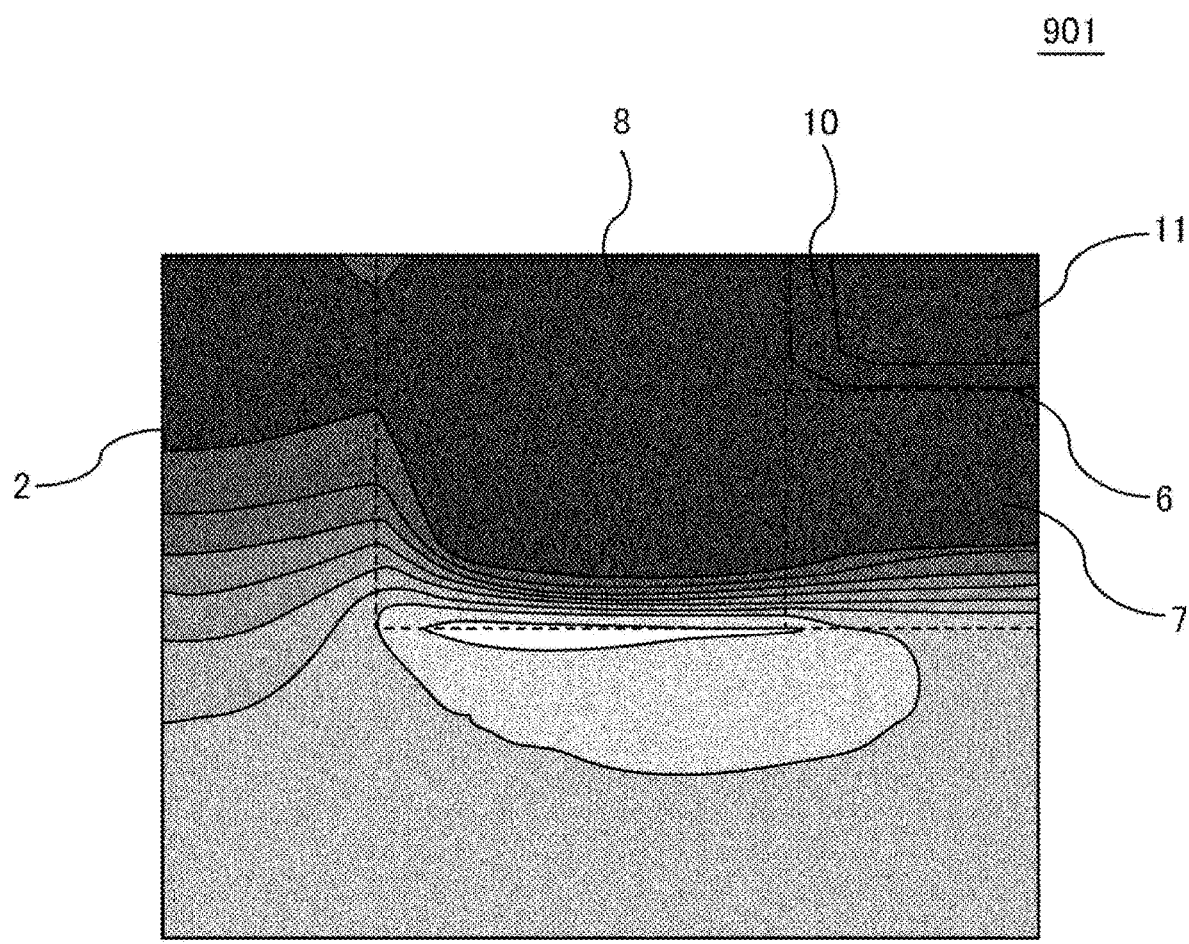
FIG. 15 is a simulation result of the electric field distribution at off time of the silicon carbide semiconductor device of the first comparative example.
Figure 16:
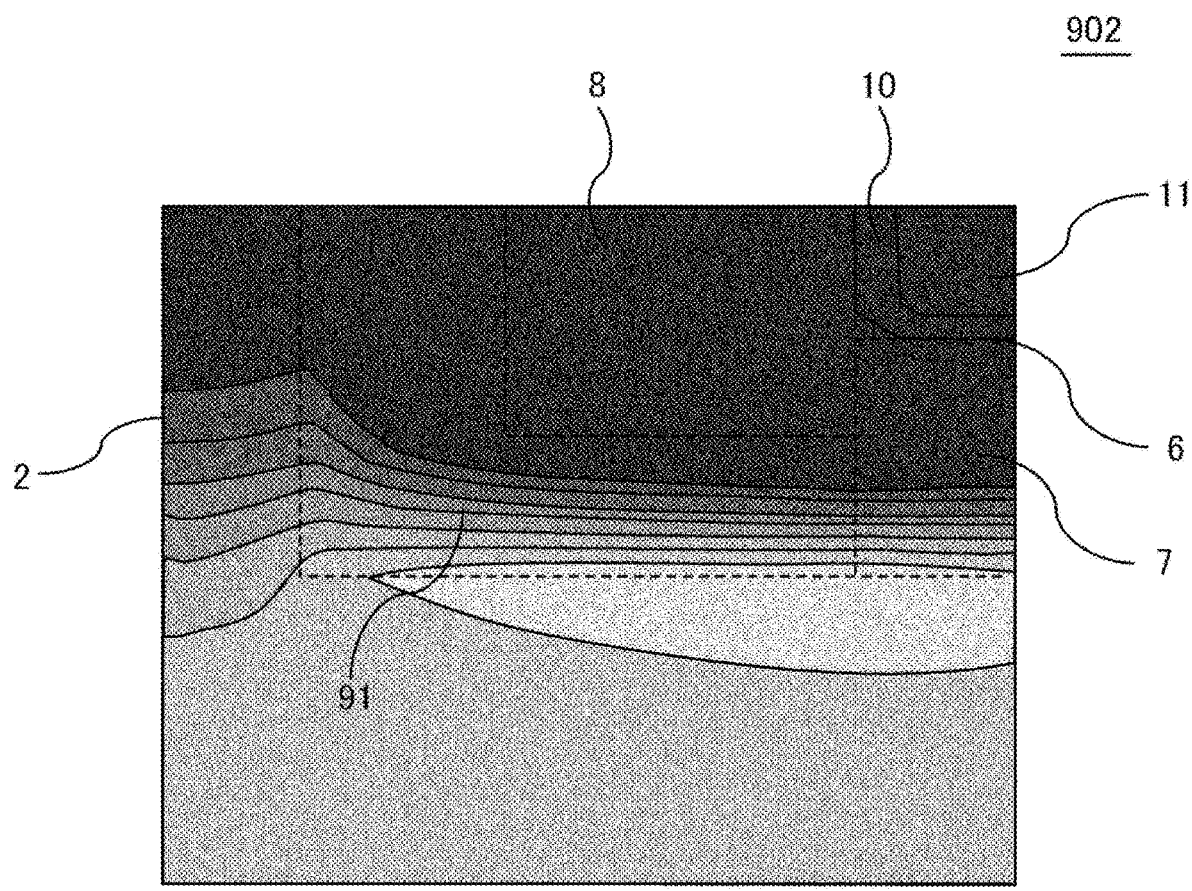
FIG. 16 is a simulation result of the electric field distribution at off time of the silicon carbide semiconductor device of the second comparative example.

FIGS. 14 to 16 show the electric field distribution in the region from near the bottom surface of the body region 3 to several μm below the protective layer 7 in the vertical direction, which represent that the closer a region to white, the higher the electric field intensity, and the closer a region to black, the lower the electric field intensity.

As shown in FIGS. 14 to 16, when the drain voltage is applied at the time of being turned off in all of the silicon carbide semiconductor devices 100, 901, and 902, inside the element, the gate insulating film 10 formed at the corner of the bottom surface of the trench 6, and the bottom surface of the protective layer 7, have a high electric field. That is, when a high voltage is applied, the electric field is likely to concentrate at these points.

In this regard, as shown in FIG. 15, in the silicon carbide semiconductor device 901 not including the electric field relaxation layer 9, the electric field is particularly concentrated in the lower part of the connection layer 8. On the other hand, as shown in FIG. 14, the electric field concentration is observed in the same place also in the silicon carbide semiconductor device 100, but the depletion layer spreads in the electric field relaxation layer 9, so that the electric field intensity at the junction, and the bottom portion of the connection layer 8, decreases. As a result, the electric field intensity at the bottom surface of the electric field relaxation layer 9 at the avalanche voltage of the silicon carbide semiconductor device 100 is about 7% lower than the electric field intensity at the bottom surface of the connection layer 8 of the silicon carbide semiconductor device 901, so that it can be said that the electric field relaxation layer 9 relaxes the junction electric field in the semiconductor layer 15 and improves the withstand voltage of the device.

In addition, as shown in FIG. 16, in the silicon carbide semiconductor device 902 provided with the second connection layer 91 having a lower impurity concentration than the connection layer 8, since the second connection layer 91 is provided on the side surface side of the connection layer 8, it can be said that the width of the second conductivity type region near the side surface of the trench 6 becomes wider, but the electric field intensity at the bottom portion of the connection layer 8 is the same as that of the silicon carbide semiconductor device 100 shown in FIG. 14, and the effect of electric field relaxation due to forming the second connection layer 91 is small. Moreover, forming the second connection layer 91 on the side surface of the connection layer 8 narrows the width of the adjacent drift layer 2 and increases the JFET resistance, which leads to an increase in the on-resistance. On the other hand, in the silicon carbide semiconductor device 100 shown in FIG. 14, the electric field relaxation effect is equivalent to that of the silicon carbide semiconductor device 902, and the width of the adjacent drift layer 2 is not narrowed, so that the increase in JFET resistance can be suppressed, and as a result, the on-resistance can be reduced.

As described above, in the silicon carbide semiconductor device 100, the electric field relaxation layer 9 is locally formed in the lower part of the connection layer 8, so that the effect of improving the electric field intensity when the device is turned off, that is, the withstand voltage, and reducing the on-resistance is produced. Thus, it can be said that the trade-off between withstand voltage and on-resistance can be improved.

Figure 17:
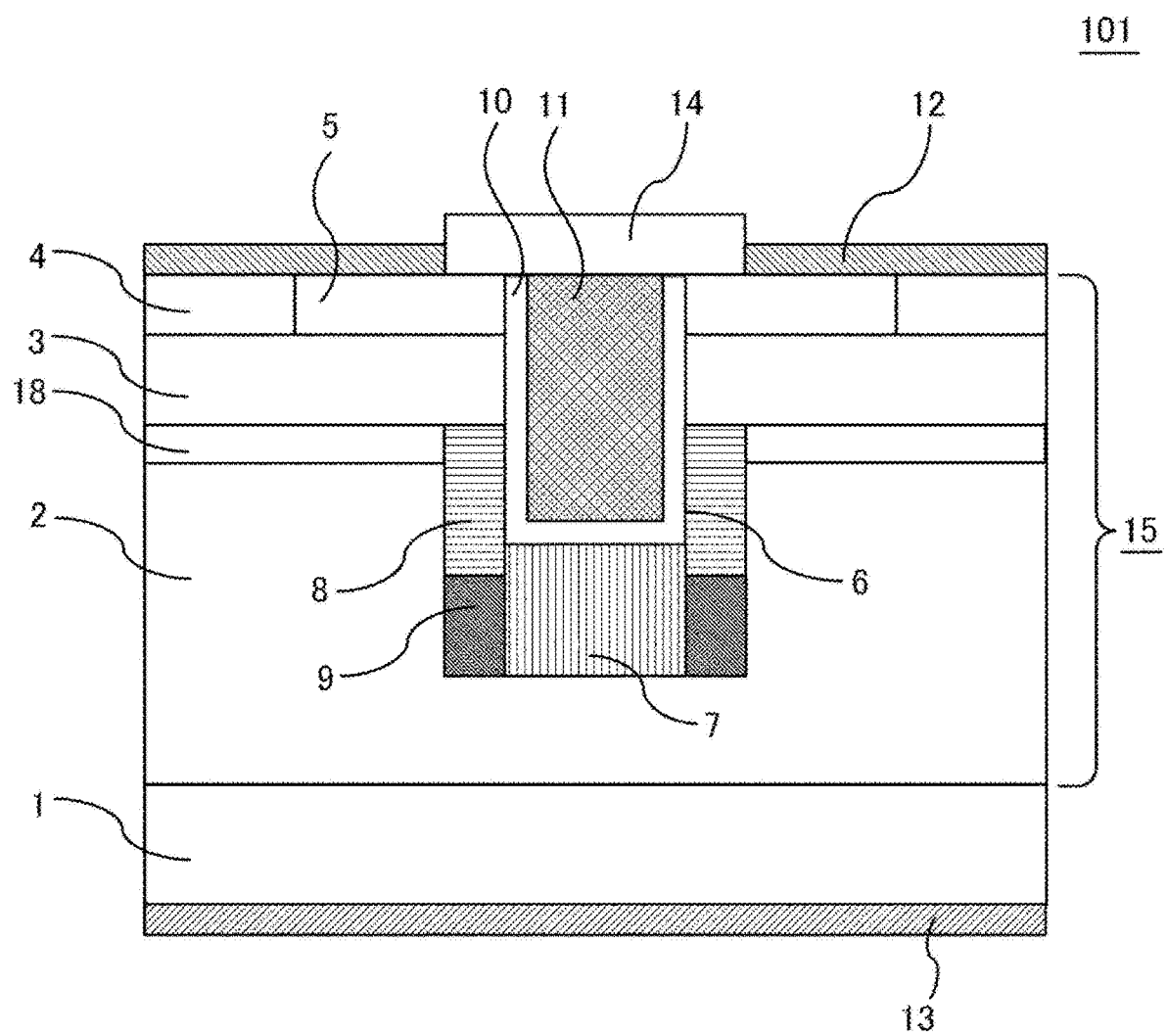
FIG. 17 is a cross-sectional view of a first modification of the silicon carbide semiconductor device of the first embodiment.

A first modification of the silicon carbide semiconductor device according to the first embodiment will be described with reference to FIGS. 17 and 18. FIG. 17 is a cross-sectional view showing a silicon carbide semiconductor device 101 modified from the silicon carbide semiconductor device 100 of the present embodiment. In addition, FIG. 18 is a cross-sectional view showing one step of the manufacturing method of the silicon carbide semiconductor device 101.

As shown in FIG. 17, a current diffusion layer 18 having a higher impurity concentration of the first conductivity type than the drift layer 2 may be further formed in the lower part of the body region 3. In this case, in the manufacturing step, in the step described with reference to FIG. 5, when each of the body region 3, the body contact region 4, and the source region 5 is formed by ion implantation in the upper part of the semiconductor layer 15, the current diffusion layer 18 is further formed as shown in FIG. 18.

In the silicon carbide semiconductor device 101 configured thus, the current is likely to be diffused laterally in the lower part of the body region 3, or the depletion layer width in the lower part of the body region 3 becomes smaller, so that the current path can be expanded. Thus, an effect is produced that the on-current density in the drift layer 2 other than the formed portion of the connection layer 8 can be increased, and the on-resistance is reduced.

A second modification of the silicon carbide semiconductor device of the first embodiment will be described with reference to FIGS. 19 to 25. FIG. 19 is a cross-sectional view showing a silicon carbide semiconductor device 102 modified from the silicon carbide semiconductor device 100 of the present embodiment. In addition, FIGS. 20 to 25 are cross-sectional views showing each step of the manufacturing method of the silicon carbide semiconductor device 102.

As shown in FIG. 19, the silicon carbide semiconductor device 102 differs from the silicon carbide semiconductor device 100 in including a two-layer structure of a first drift layer 21 and a second drift layer 22 instead of the drift layer 2 provided in the semiconductor layer 15 of the silicon carbide semiconductor device 100. This is due to the manufacturing method of the silicon carbide semiconductor device 102.

A method for manufacturing the silicon carbide semiconductor device 102 will be described with reference to FIGS. 20 to 25.

As shown in FIG. 20, a first drift layer 21 of the first conductivity type is formed by epitaxial crystal growth on a substrate 1 being a silicon carbide substrate of the first conductivity type. At this time, the impurity concentration of the first conductivity type in the first drift layer 21 is formed so as to be included in the impurity concentration range of the first conductivity type in the drift layer 2 described in the silicon carbide semiconductor device 100 according to the first embodiment.

Figure 21:
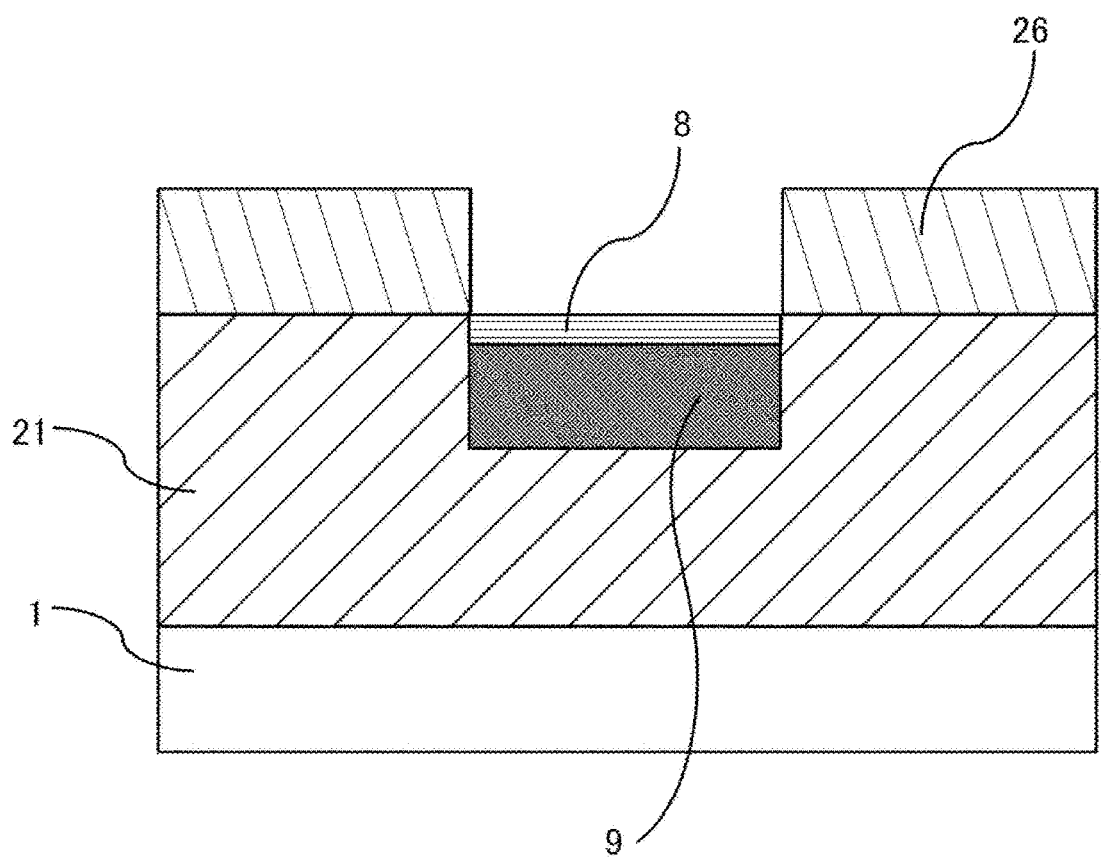
FIG. 21 is a cross-sectional view showing a second step in the manufacturing steps of the second modification of the silicon carbide semiconductor device of the first embodiment.

As shown in FIG. 21, a mask 26 having an opening is formed on the semiconductor layer 15. Then, ion implantation using this mask 16 forms the electric field relaxation layer 9 and one part of the connection layer 8 of the second conductivity type. At this time, the impurity concentration of the second conductivity type of the electric field relaxation layer 9 is set to be lower than the impurity concentration of the second conductivity type of the connection layer 8.

Figure 22:
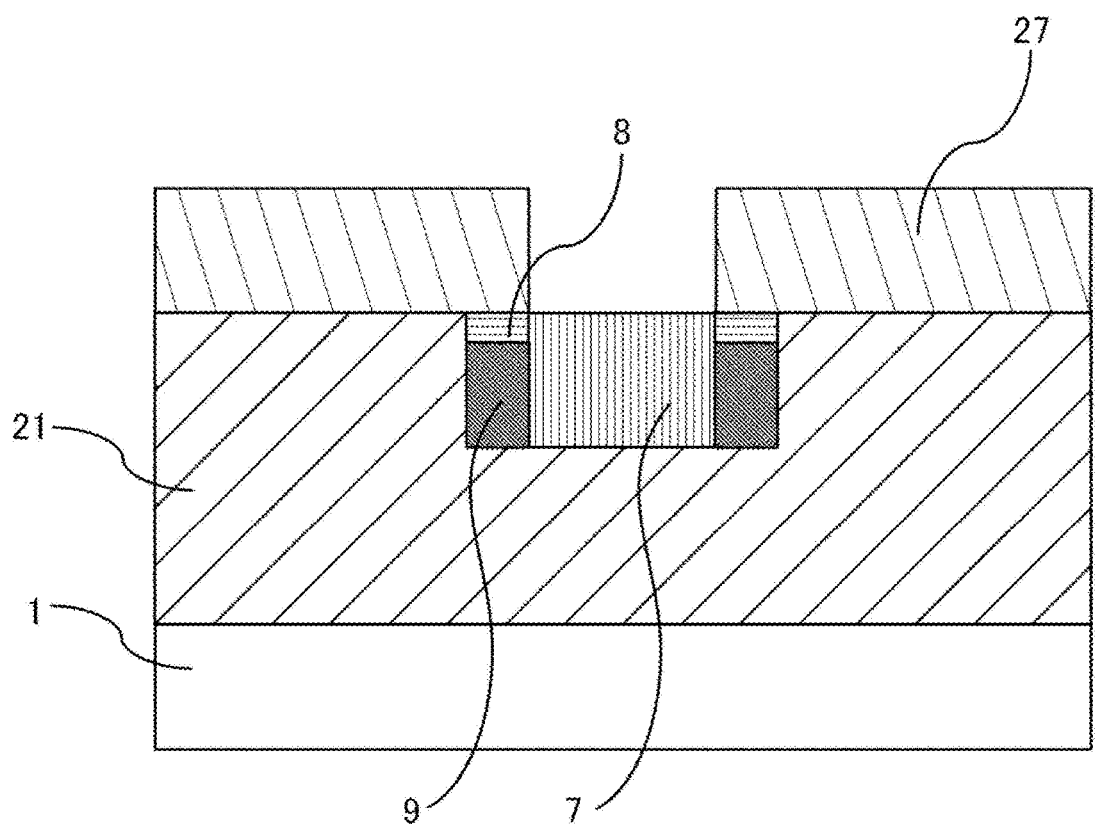
FIG. 22 is a cross-sectional view showing a third step in the manufacturing steps of the second modification of the silicon carbide semiconductor device of the first embodiment.

As shown in FIG. 22, a mask 27 having a narrower opening than the mask 26 in FIG. 21 is formed. Ion implantation using this mask 27 forms a protective layer 7 of the second conductivity type in some regions of the electric field relaxation layer 9 and the connection layer 8 formed in FIG. 21.

Figure 23:
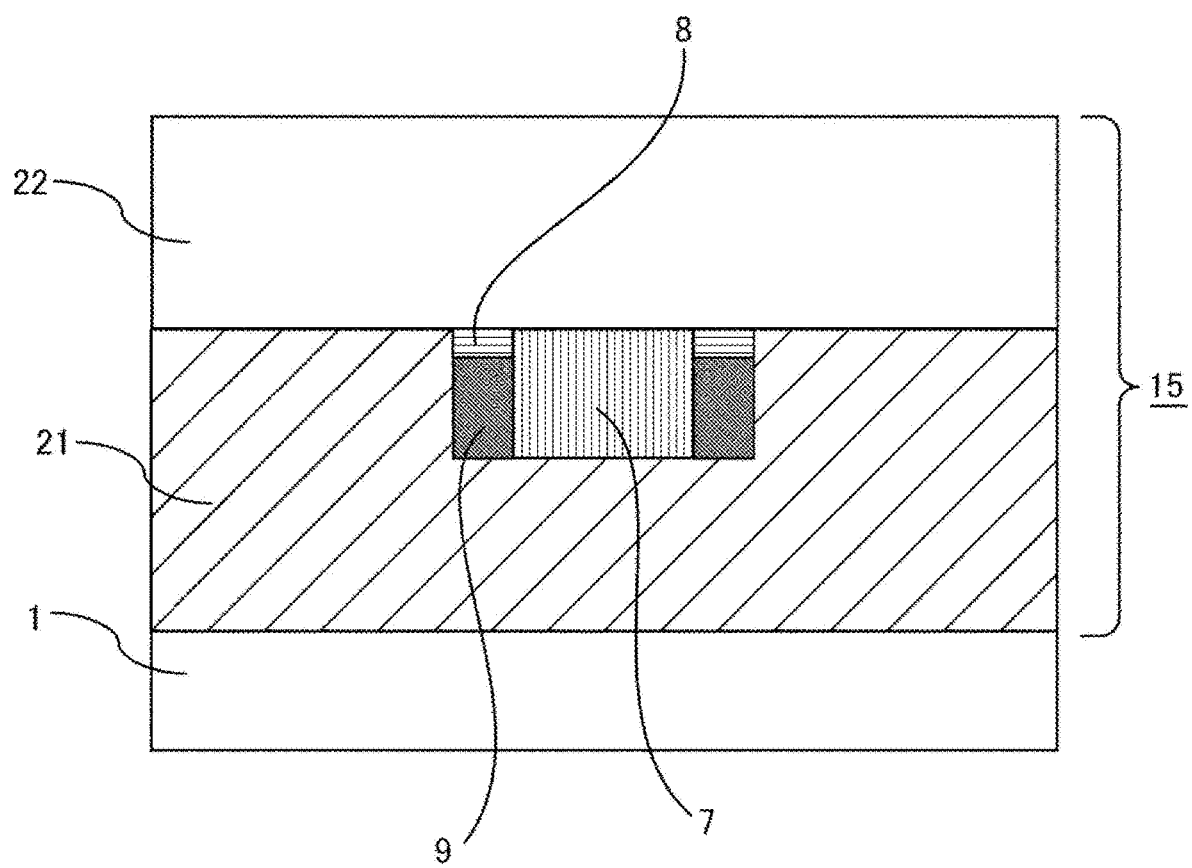
FIG. 23 is a cross-sectional view showing a fourth step in the manufacturing steps of the second modification of the silicon carbide semiconductor device of the first embodiment.

As shown in FIG. 23, a second drift layer 22 of the first conductivity type is formed on the first drift layer 21 by epitaxial crystal growth. At this time, the impurity concentration of the first conductivity type of the second drift layer 22 has only to be included in the impurity concentration range of the first conductivity type in the drift layer 2 described above, and may be the same as or different from the impurity concentration of the first conductivity type of the first drift layer 21.

Figure 24:
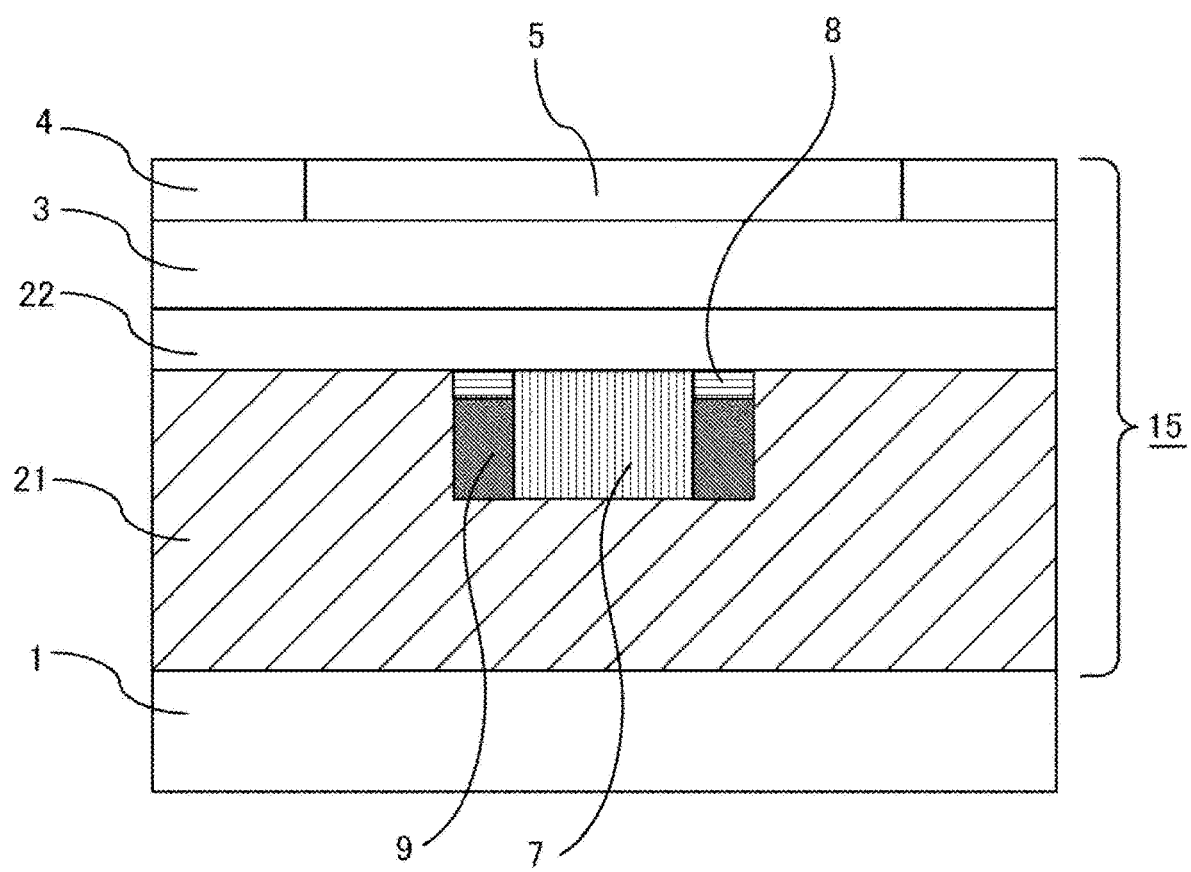
FIG. 24 is a cross-sectional view showing a fifth step in the manufacturing steps of the second modification of the silicon carbide semiconductor device of the first embodiment.

As shown in FIG. 24, the body region 3, the body contact region 4, and the source region 5 are formed in the second drift layer 22. The body region 3 can be formed by ion implantation or epitaxial crystal growth.

As shown in FIG. 25, a mask 28 having an opening is formed on the body contact region 4 and the source region 5. Reactive ion etching (RIE) forms a trench 6 that penetrates the source region 5 and the body region 3 from the front surface of the source region 5 exposed to the opening of the mask 28 to reach the bottom surface of the second drift layer 22, that is, the front surface of the protective layer 7.

Thereafter, by slantingly ion implanting from the direction perpendicular to the front surface toward the side surface of the trench 6 of the semiconductor layer 15, the remaining portion of the connection layer 8 in contact with the body region 3 is formed in the second drift layer 22 so as to be in contact with the front surface of the one part of the connection layer 8 already formed in the first drift layer 21. At this time, the width of the connection layer 8 may be nonuniform. In addition, the connection layer 8 may be formed by ion implanting in a direction perpendicular to the front surface.

Furthermore, the gate insulating film 10 is formed on the bottom surface and the side surface in the trench 6, and the gate electrode 11 is formed on the gate insulating film 10 so as to be embedded in the trench 6. Then, after the interlayer insulating film 14 is formed so as to cover the gate electrode 11, the source electrode 12 is formed so as to be in contact with the front surface of the source region 5 and the front surface of the body contact region 4, and the drain electrode 13 is formed on the back surface of the substrate 1.

Through the above steps, the silicon carbide semiconductor device 102 shown in FIG. 19 is completed.

In the silicon carbide semiconductor device 102 configured thus, since a device structure is made in which the second drift layer 22 is formed after the electric field relaxation layer 9 is formed, the electric field relaxation layer 9 can be formed at a deeper position in the drift layer. This produces the effect that below the trench 6, the width of the electric field relaxation layer 9 can be widely formed regardless of the width of the trench 6.

Second Embodiment

The silicon carbide semiconductor device of the second embodiment will be described with reference to FIG. 26. FIG. 26 is a cross-sectional view showing the silicon carbide semiconductor device 200 of the present embodiment.

The silicon carbide semiconductor device 200 is different from the silicon carbide semiconductor device 100 of the first embodiment in the configuration of the protective layer 7 and the manufacturing method thereof. Since the other configuration and manufacturing method of the silicon carbide semiconductor device 200 are the same as those of the silicon carbide semiconductor device 100, the description thereof will be omitted.

As shown in FIG. 26, in the silicon carbide semiconductor device 200, the protective layer 7 of the second conductivity type provided below the trench 6 includes two layers, a first protective layer 7a having a high impurity concentration and a second protective layer 7b provided below the first protective layer 7a and having a lower impurity concentration than the first protective layer 7a.

A method for manufacturing the silicon carbide semiconductor device 200 will be described.

In the method for manufacturing the silicon carbide semiconductor device 100 according to the first embodiment, after up to the formation of the trench 6 is completed in the same manner as described with reference to FIGS. 4 to 6, the second protective layer 7b is formed in the drift layer 2 on the bottom surface of the trench 6 by ion implantation.

Thereafter, with ion implantation energy less than that when the second protective layer 7b is formed, the first protective layer 7a having a higher impurity concentration than the second protective layer 7b is formed below the trench 6 and above the second protective layer 7b by ion implantation.

After the protective layer 7 including the first protective layer 7a and the second protective layer 7b is formed in this way, in the same steps as described with reference to FIG. 8 and subsequent figures in the method for manufacturing the silicon carbide semiconductor device 100 according to the first embodiment, the other configurations are formed and the silicon carbide semiconductor device 200 is completed.

It should be noted that the protective layer 7 including the first protective layer 7a and the second protective layer 7b is not limited to the manufacturing method in which the protective layer 7 is formed after the trench 6 is formed, and for example, the first protective layer 7a and the second protective layer 7b can also be locally formed in the semiconductor layer 15 from the front surface of the semiconductor layer 15 shown in FIG. 4 described as the manufacturing method of the silicon carbide semiconductor device 100 of the first embodiment.

In addition, in the same steps as the steps of forming the protective layer 7 shown in FIG. 22 described as the manufacturing method of the silicon carbide semiconductor device 102 by ion implantation, it is also possible to form the first protective layer 7a and the second protective layer 7b by ion implantation and then form the second drift layer 22 by epitaxial crystal growth.

The effect of the silicon carbide semiconductor device 200 configured thus will be described.

In a trench gate silicon carbide semiconductor device, an electric field is concentrated near the bottom surface of the protective layer 7 when the device is turned off. Therefore, the protective layer 7 includes the first protective layer 7a and the second protective layer 7b provided below the first protective layer 7a and having a lower impurity concentration than the first protective layer 7a, whereby the width of the depletion layer spreading in the second protective layer 7b having a lower impurity concentration can be expanded and the electric field intensity at the junction in the depletion layer can be reduced, so that the effect of capable of improving the withstand voltage is produced.

In addition, the impurity concentration of the second protective layer 7b is preferably equal to or higher than the impurity concentration of the adjacent electric field relaxation layer 9. When the electric field is concentrated on the protective layer 7 and the bottom portion of the electric field relaxation layer 9, a portion likely to have a highest electric field is the corner portion of the electric field relaxation layer 9 whose bottom surface and side surfaces are exposed to the drift layer 2. Therefore, by setting the impurity concentration of the second protective layer 7b to an impurity concentration equal to or higher than that of the electric field relaxation layer 9, the width from the junction of the depletion layer spreading in the second protective layer 7b is equal to or less than the width of the depletion layer that spreads within the electric field relaxation layer 9. Thus, making the electric field likely to be applied to the bottom surface of the second protective layer 7b relaxes the electric field concentrated on the electric field relaxation layer 9, and the effect of allowing the withstand voltage to improve is further produced.

Third Embodiment

The silicon carbide semiconductor device of the third embodiment will be described with reference to FIG. 27. FIG. 27 is a cross-sectional view showing the silicon carbide semiconductor device 300 of the present embodiment.

The silicon carbide semiconductor device 300 is different from the silicon carbide semiconductor device 100 of the first embodiment in the configuration of the connection layer 8 and the electric field relaxation layer 9 and the manufacturing method thereof. Since the other configuration and manufacturing method of the silicon carbide semiconductor device 300 are the same as those of the silicon carbide semiconductor device 100, the description thereof will be omitted.

As shown in FIG. 27, in the silicon carbide semiconductor device 300, the electric field relaxation layer 9 is provided so as to be in contact with the bottom surface of the connection layer 8 and the bottom surface of the protective layer 7. That is, the electric field relaxation layers 9 positioned below the connection layers 8 opposite to each other with interposition of the trench 6 are provided connected below the protective layer 7.

A method for manufacturing the silicon carbide semiconductor device 300 will be described.

In the method for manufacturing the silicon carbide semiconductor device 100 of the first embodiment, after up to the formation of the protective layer 7 is completed in the same manner as described with reference to FIGS. 4 to 7, slanted ion implantation is performed from the inner wall of the trench 6, with the mask 16 kept formed or with the mask 16 removed. At this time, ion implantation is performed on the side surface of the trench 6 at a small implantation angle and with an energy higher than the implantation energy at the time of forming the protective layer 7, and the electric field relaxation layer 9 is formed below the bottom surface of the protective layer 7.

After the electric field relaxation layer 9 is thus formed below the protective layer 7, the silicon carbide semiconductor device 300 is completed by forming the other configurations in the same manner as described with reference to FIG. 9 and subsequent figures in the method for manufacturing the silicon carbide semiconductor device 100 of the first embodiment.

It should be noted that the electric field relaxation layers 9 are not limited to being connected at the bottom surface of the protective layer 7, and may be provided separated from each other so as to be in contact with at least a part of the bottom surface of the protective layer.

In addition, when the connection layer 8 and the electric field relaxation layer 9 are formed only on any one of the first side surface 6a and the second side surface 6b of the trench 6, the electric field relaxation layer 9 may be provided so that at least a part of the electric field relaxation layer 9 is in contact with the bottom surface of the protective layer 7. Alternatively, the electric field relaxation layer 9 may be formed by ion implantation in the first drift layer 21 as in the silicon carbide semiconductor device 102, and then the second drift layer 22 may be formed, and the protective layer 7 may be formed so as to be in contact with the electric field relaxation layer 9.

The effect of the silicon carbide semiconductor device 300 configured thus will be described.

In the silicon carbide semiconductor device 300, since the electric field relaxation layer 9 is formed below the protective layer 7, the depletion layer spreads in the electric field relaxation layer 9 when the device is turned off, and the electric field in the portion can be relaxed. Since the electric field relaxation layer 9 has a lower impurity concentration than the protective layer 7, the depletion layer width in the electric field relaxation layer 9 is wider than the depletion layer width in the protective layer 7, so that the electric field intensity at the junction is lowered, and as a result, the effect of allowing the withstand voltage of the element to improve is produced.

In addition, since the electric field relaxation layer 9 is formed so as to be astride the bottom surfaces of the connection layer 8 and the protective layer 7, the position of the junction with the drift layer 2 of the portion becomes constant, and local electric field concentration due to the unevenness of the junction can be suppressed. It should be noted that in this case, it is preferable that the depths of the bottom surface of the protective layer 7 and the bottom surface of the connection layer 8 are constant. By making them constant, the concentration profiles of the bottom surfaces of the protective layer 7 and the connection layer 8 become uniform, the local electric field concentration on the corner portion of the protective layer 7 and the bottom portion of the connection layer 8 can be relaxed, and the effect of allowing the withstand voltage to be improved is further produced. In addition, since the thickness in the device vertical direction of the electric field relaxation layer 9 is constant in the device horizontal direction, the depletion layer spreads uniformly in the vertical direction, and the effect of allowing the electric field intensity near the lower part of the protective layer 7 to be reduced is produced.

Fourth Embodiment

The silicon carbide semiconductor device of the fourth embodiment will be described with reference to FIG. 28. FIG. 28 is a cross-sectional view showing the silicon carbide semiconductor device 400 of the present embodiment.

The silicon carbide semiconductor device 400 is different from the silicon carbide semiconductor device 100 of the first embodiment in that a low resistance layer 23 of the first conductivity type is provided on the side surface of the connection layer 8. Since the other configuration and manufacturing method of the silicon carbide semiconductor device 400 are the same as those of the silicon carbide semiconductor device 100, the description thereof will be omitted.

As shown in FIG. 28, in the silicon carbide semiconductor device 400, the low resistance layer 23 having a higher first conductivity type impurity concentration than the drift layer 2 is provided so as to be in contact with the side surface of the connection layer 8. The low resistance layer 23 is provided so as to be in contact with the first side surface opposite to the trench 6 of the connection layer 8.

A method for manufacturing the silicon carbide semiconductor device 400 will be described.

In the method for manufacturing the silicon carbide semiconductor device 100 of the first embodiment, after up to the formation of the trench 6 is completed in the same steps as described with reference to FIGS. 4 to 6, donor ions are slantingly ion implanted toward the side of the trench 6, whereby a low resistance layer 23 having a higher impurity concentration of the first conductivity type than the drift layer 2 is formed.

After the low resistance layer 23 is thus formed, the silicon carbide semiconductor device 400 is completed by forming the other configurations in the same steps as described with reference to FIG. 7 and subsequent figures in the method for manufacturing the silicon carbide semiconductor device 100 of the first embodiment.

It should be noted that in the formation of the low resistance layer 23, donor ions may be implanted vertically from the front surface of the semiconductor layer 15, and the low resistance layer 23 may be formed so as to be in contact with at least a part of the side surface of the protective layer 7.

The effect of the silicon carbide semiconductor device 400 configured thus will be described.

Since the connection layer 8 is formed lateral to the trench 6, it can be said that the connection layer 8 is formed near the channel and the on-current path. Therefore, since the low resistance layer 23 having a higher concentration than the drift layer 2 in contact with the side surface of the connection layer 8 is provided, the width of the depletion layer extending from the connection layer 8 toward the drift layer 2 is reduced, and the JFET resistance of the portion can be reduced. This makes it possible to reduce the JFET resistance in the region between the connection layers 8 facing each other with interposition of the drift layer 2. In this way, the distance between the adjacent connection layers 8 in a direction perpendicular to the extending direction of the trench 6 in which each of the connection layers 8 is formed can be shortened. That is, since the spacing between the trenches 6, and the cell pitch can be shortened, the on-resistance can be reduced, and the electric field concentration on near the bottom portion of the protective layer 7 when the device is turned off is suppressed, which produces the effect of allowing the withstand voltage to improve.

In addition, since the JFET resistance is reduced by the low resistance layer 23, the distance between the adjacent connection layers 8 can be shortened in the extending direction of the trench 6 in which each of the connection layers 8 is formed. Thus, the withstand voltage can be improved by suppressing the electric field concentration on the bottom portion of the connection layer 8 when the device is turned off, and the total area of the protective layer 7 in contact with the connection layer 8 can be increased, so that as a result of capable of reducing the resistance between the protective layer 7 and the source electrode 12, the effect is produced of allowing the loss during switching to be reduced.

Figure 29:
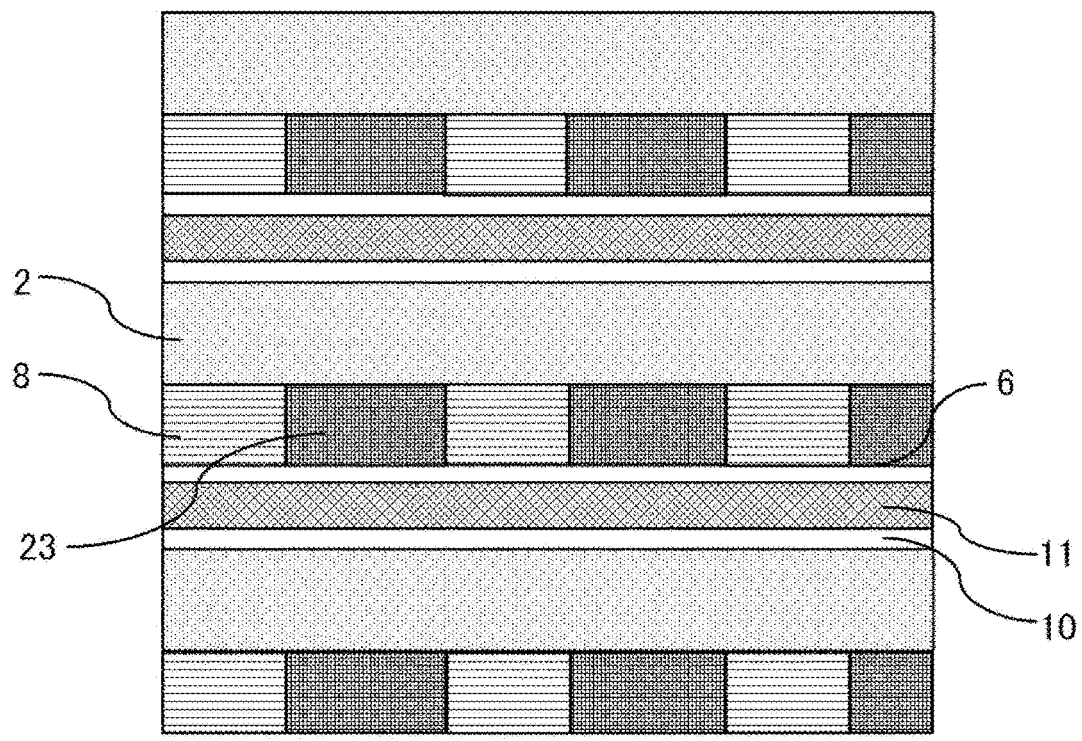
FIG. 29 is a cross-sectional view of a modification of the silicon carbide semiconductor device of the fourth embodiment.

A modification of the silicon carbide semiconductor device of the fourth embodiment will be described with reference to FIG. 29. FIG. 29 is a plan view showing a silicon carbide semiconductor device modified from the silicon carbide semiconductor device 400 of the present embodiment.

As shown in FIG. 29, the first side surface opposite to the side surface of the trench 6 of the connection layer 8 may be in contact with the drift layer 2, and the low resistance layer 23 may be provided so as to be in contact with the second side surface intersecting the first side surface and the third side surface opposite to the second side surface. At this time, it is preferable that the side surface of the trench 6 not in contact with the connection layer 8 is covered with the low resistance layer 23 in the active region where the channel is formed.

The silicon carbide semiconductor device 400 configured thus produces the effect of allowing the JFET resistance around the connection layer 8 to be further reduced. When the low resistance layer 23 is formed on the side surface opposite to the trench 6 of the connection layer 8, the cell pitch can be reduced, so that both reduction in the on-resistance and improvement in the withstand voltage can be achieved. Furthermore, when the connection layers 8 are formed separated in the extending direction of the trench 6 and when the low resistance layer 23 is formed between the connection layers 8, the effect is produced of narrowing the distance between the connection layers 8, allowing reduction in the switching loss due to the expansion of the connection area between the protective layer 7 and the connection layer 8, and allowing reduction in the electric field intensity at the bottom surface of each connection layer.

Fifth Embodiment

In the present embodiment, the semiconductor device according to the above-described first to fourth embodiments is applied to a power conversion apparatus. Although the present disclosure is not limited to a specific power conversion apparatus, in the following, a case where the present invention is applied to a three-phase inverter will be described as a fifth embodiment.

FIG. 30 is a block diagram showing a configuration of a power conversion system to which the power conversion apparatus according to the present embodiment is applied.

The power conversion system shown in FIG. 30 includes a power supply 510, a power conversion apparatus 500, and a load 520. The power supply 510 is a DC power supply, and supplies DC power to the power conversion apparatus 500. The power supply 510 can include various components, can include, for example, a DC system, a solar cell, and a storage battery, and may include a rectifier circuit or an AC/DC converter connected to an AC system. In addition, the power supply 510 may include a DC/DC converter for converting DC power output from the DC system into predetermined power.

The power conversion apparatus 500 is a three-phase inverter connected between the power supply 510 and the load 520, converts DC power supplied from the power supply 510 into AC power, and supplies AC power to the load 520. As shown in FIG. 30, the power conversion apparatus 500 includes a main conversion circuit 501 for converting DC power into AC power to output the converted power, a drive circuit 502 for outputting a drive signal for driving each switching element of the main conversion circuit 501, and a control circuit 503 for outputting a control signal for controlling the drive circuit 502 to the drive circuit 502.

The load 520 is a three-phase electric motor driven by AC power supplied from the power conversion apparatus 500. It should be noted that the load 520 is not limited to a specific application, and is a motor mounted on various electric apparatuses, and is used as, for example, a hybrid vehicle, an electric vehicle, a railway vehicle, an elevator, or a motor for an air conditioner.

Hereinafter, details of the power conversion apparatus 500 will be described. The main conversion circuit 501 includes a switching element and a freewheeling diode (not shown), and switching of the switching element converts the DC power supplied from the power supply 510 into AC power to supply the AC power to the load 520. There are various specific circuit configurations of the main conversion circuit 501, and the main conversion circuit 501 according to the present embodiment is a two-level three-phase full bridge circuit and can include six switching elements and six freewheeling diodes antiparallel to the respective switching elements. A semiconductor device according to any one of the above-described first to fourth embodiments is applied to each switching element of the main conversion circuit 501. The six switching elements are connected in series for every two switching elements to constitute upper and lower arms, and the respective upper and lower arms constitute each phase (U phase, V phase, and W phase) of the full bridge circuit. Then, the output terminals of the respective upper and lower arms, that is, the three output terminals of the main conversion circuit 501 are connected to the load 520.

The drive circuit 502 generates drive signals for driving the switching elements of the main conversion circuit 501, and supplies the drive signals to the control electrodes of the switching elements of the main conversion circuit 501. Specifically, in accordance with a control signal from a control circuit 503 described below, a drive signal to turn on the switching element and a drive signal to turn off the switching element are output to the control electrodes of the respective switching elements. When the switching element is maintained in the ON state, the drive signal is a voltage signal not less than the threshold voltage of the switching element (ON signal), and when the switching element is maintained in the OFF state, the drive signal is a voltage signal not more than the threshold voltage of the switching element (OFF signal).

The control circuit 503 controls the switching elements of the main conversion circuit 501 so that desired power is supplied to the load 520. Specifically, based on the power to be supplied to the load 520, the time required for each switching element of the main conversion circuit 501 to be turned on (ON time) is calculated. For example, the main conversion circuit 501 can be controlled by PWM control for modulating the ON time of the switching element according to the voltage to be output. Then, a control instruction (control signal) is output to the drive circuit 502 so that, at each time point, the ON signal is output to the switching element to be turned on and the OFF signal is output to the switching element to be turned off. The drive circuit 502 outputs the ON signal or OFF signal as a drive signal to the control electrode of each switching element in accordance with the control signal.

In the power conversion apparatus according to the present embodiment, since the silicon carbide semiconductor device according to the first to fourth embodiments is applied as a switching element of the main conversion circuit 501, high efficiency operation can be achieved.

In the present embodiment, an example in which the present invention is applied to a two-level three-phase inverter is described, but the present invention is not limited to this, and can be applied to various power conversion apparatuses. In the present embodiment, a two-level power conversion apparatus is used, but a three-level or multilevel power conversion apparatus may be used, and when power is supplied to a single-phase load, the present invention may be applied to a single-phase inverter. In addition, when power is supplied to a DC load or the like, the present invention can also be applied to a DC/DC converter or an AC/DC converter.

In addition, the power conversion apparatus in the present disclosure is not limited to the case where the load described above is a motor, and can also be used as a power supply device for, for example, an electrical discharge machine, a laser machine, an induction heating cooker, or a non-contact feeding system, and furthermore, can also be used as a power conditioner of a solar power generation system, a storage system, or the like.

It should be noted that appropriately combining, modifying, or omitting each embodiment is also included in the scope of the present disclosure.

The invention claimed is:

1. A silicon carbide semiconductor device comprising:
   a substrate of a first conductivity type;
   a drift layer of a first conductivity type made of silicon carbide provided on the substrate;
   a body region of a second conductivity type provided on the drift layer;
   a source region of a first conductivity type provided on the body region;
   a source electrode connected to the source region;
   a gate insulating film provided on an inner surface of a trench, the trench penetrating the body region and the source region and having a bottom surface positioned inside the drift layer;
   a gate electrode provided inside the trench with interposition of the gate insulating film;
   a protective layer of a second conductivity type provided below the gate insulating film;
   a connection layer of a second conductivity type provided inside the drift layer and being in contact with the protective layer and the body region; and
   an electric field relaxation layer of a second conductivity type being in contact with a bottom surface of the connection layer, provided below the connection layer, and having a lower impurity concentration of a second conductivity type than the connection layer.

2. The silicon carbide semiconductor device according to claim 1, wherein an impurity concentration of a second conductivity type of the electric field relaxation layer is lower than an impurity concentration of a second conductivity type of the protective layer.

3. The silicon carbide semiconductor device according to claim 1, wherein the protective layer includes:
   a high-concentration protective layer provided on a bottom surface side of the trench and having a higher impurity concentration of a second conductivity type than the body region, and
   a low-concentration protective layer provided in contact with below the high-concentration protective layer and having a lower impurity concentration of a second conductivity type than the high-concentration protective layer.

4. The silicon carbide semiconductor device according to claim 1, further comprising a low resistance layer of a first conductivity type provided in contact with a side surface of the connection layer and having a higher impurity concentration of a first conductivity type than the drift layer.

5. The silicon carbide semiconductor device according to claim 1, wherein the electric field relaxation layer is in contact with a bottom surface of the protective layer.

6. The silicon carbide semiconductor device according to claim 1,
   wherein the connection layer includes the connection layers, and the connection layers are provided so as to face each other with interposition of the trench, and
   wherein the electric field relaxation layers are provided so as to be in contact with bottom surfaces of the connection layers facing each other with interposition of the trench, and a bottom surface of the protective layer, and be connected below the protective layer.

7. The silicon carbide semiconductor device according to claim 1, wherein a width of the electric field relaxation layer is equal to or less than a width of the connection layer.

8. The silicon carbide semiconductor device according to claim 1, wherein the drift layer includes two layers, a first drift layer and a second drift layer.

9. A power conversion apparatus comprising:
   a main conversion circuit including the silicon carbide semiconductor device according to claim 1 and configured to convert input power and output converted power;
   a drive circuit configured to output a drive signal to the silicon carbide semiconductor device; and
   a control circuit configured to output a control signal to the drive circuit.

10. The silicon carbide semiconductor device according to claim 1, wherein a side surface of the connection layer directly contacts a side surface of the protective layer.

11. A method for manufacturing a silicon carbide semiconductor device, the method comprising:
    forming a semiconductor layer of a first conductivity type made of silicon carbide on a substrate;
    forming a body region of a second conductivity type in an upper part inside the semiconductor layer;
    forming a source region of a first conductivity type on a front surface of the body region;
    forming a trench penetrating the body region from a front surface of the source region;
    forming a gate insulating film on an inner surface of the trench;
    forming a gate electrode inside the trench with interposition of the gate insulating film;
    forming a protective layer of a second conductivity type below the gate insulating film;
    forming an electric field relaxation layer of a second conductivity type by slantingly implanting ions into a region lateral to the protective layer; and
    forming a connection layer of a second conductivity type having a higher impurity concentration of a second conductivity type than the electric field relaxation layer by slantingly implanting ions into a region above the electric field relaxation layer.

12. The method for manufacturing a silicon carbide semiconductor device according to claim 11,
    wherein the connection layer is formed by slanted ion implantation with a slant of an angle θ1 from a direction perpendicular to a front surface of the source region,
    wherein the electric field relaxation layer is formed by slanted ion implantation with a slant of an angle θ2 from a direction perpendicular to a front surface of the source region, and
    wherein the angle θ1 is larger than the angle θ2.

13. A method for manufacturing a silicon carbide semiconductor device, the method comprising:
    forming a first drift layer of a first conductivity type made of silicon carbide on a substrate;

forming an electric field relaxation layer of a second conductivity type inside the first drift layer;

forming one part of a connection layer of a second conductivity type having a higher impurity concentration of a second conductivity type than the electric field relaxing layer so as to be in contact with a front surface of the electric field relaxing layer in an upper part inside the first drift layer;

forming a protective layer in a part of a region where the electric field relaxation layer and the connection layer are formed;

forming a second drift layer of a first conductivity type on the first drift layer by epitaxial crystal growth;

forming a body region of a second conductivity type in an upper part inside the second drift layer;

forming a source region of a first conductivity type on a front surface of the body region;

forming a trench penetrating the body region from a front surface of the source region;

forming another part of the connection layer inside the second drift layer so as to be in contact with the one part of the connection layer on a front surface side;

forming a gate insulating film on an inner surface of the trench; and forming a gate electrode inside the trench with interposition of the gate insulating film.

\* \* \* \* \*